(12) United States Patent
Sirigineedi et al.

(10) Patent No.: US 11,143,718 B2
(45) Date of Patent: Oct. 12, 2021

(54) MONITORING SYSTEMS AND METHODS FOR ESTIMATING THERMAL-MECHANICAL FATIGUE IN AN ELECTRICAL FUSE

(71) Applicant: EATON INTELLIGENT POWER LIMITED, Dublin (IE)

(72) Inventors: Gopinadh Sirigineedi, Pune (IN); Pandarinath R, Pune (IN); Ravishankar S, Pune (IN); Robert Stephen Douglass, Wildwood, MO (US); Harold Handcock, Kinoulton (GB)

(73) Assignee: EATON INTELLIGENT POWER LIMITED, Dublin (IE)

( * ) Notice: Subject to any disclaimer, the term of this patent is extended or adjusted under 35 U.S.C. 154(b) by 567 days.

(21) Appl. No.: 15/994,513

(22) Filed: May 31, 2018

(65) Prior Publication Data

US 2019/0369155 A1 Dec. 5, 2019

(51) Int. Cl.
*G01R 31/74* (2020.01)
*H01H 85/08* (2006.01)
(Continued)

(52) U.S. Cl.
CPC ............. *G01R 31/74* (2020.01); *H01H 85/08* (2013.01); *H01H 85/17* (2013.01); *G01K 7/22* (2013.01); *G01K 7/427* (2013.01)

(58) Field of Classification Search
CPC ........ G01R 31/74; H01H 85/08; H01H 85/17; G01K 7/427; G01K 7/22
See application file for complete search history.

(56) References Cited

U.S. PATENT DOCUMENTS 901,261 A 10/1908 Reynolds et al.
2,856,488 A 10/1958 Kozacka
(Continued)

FOREIGN PATENT DOCUMENTS

CN 101776720 B 9/2011
CN 101789578 B 7/2012
(Continued)

OTHER PUBLICATIONS

International Search Report and Written Opinion of International Application No. PCT/US2016/041458, dated Oct. 28, 2016, 14 pages.
(Continued)

*Primary Examiner* — Amy He
(74) *Attorney, Agent, or Firm* — Armstrong Teasdale LLP

(57) ABSTRACT

Thermal-mechanical fatigue assessment systems and methods include a controller operable to estimate a temperature of the conductor having a non-linear resistance based on an ambient temperature input and a current input for current flow through the conductor when connected to an energized electrical power system. A state of fatigue of the conductor may be assessed in view of an estimated first temperature differential between the conductor and an arc extinguishing medium surrounding the conductor, an estimated temperature differential between the temperature of the arc quenching medium and the ambient temperature, and the estimated temperature of the conductor.

20 Claims, 18 Drawing Sheets

(51) Int. Cl.
*H01H 85/17* (2006.01)
*G01K 7/42* (2006.01)
*G01K 7/22* (2006.01)

(56) References Cited

U.S. PATENT DOCUMENTS

| | | | |
|---|---|---|---|
| 3,460,085 A | 8/1969 | McAllister |
| 3,601,737 A | 8/1971 | Baird et al. |
| 3,603,909 A | 9/1971 | Salzer et al. |
| 3,636,491 A | 1/1972 | Cameron |
| 3,684,923 A | 8/1972 | Keeler, II |
| 3,777,370 A | 12/1973 | Wakui |
| 3,958,206 A | 5/1976 | Klint |
| 4,041,435 A | 8/1977 | Gaia et al. |
| 4,198,615 A | 4/1980 | Mahieu |
| 4,219,795 A | 8/1980 | Jacobs et al. |
| 4,237,440 A | 12/1980 | Miyasaka et al. |
| 4,284,126 A | 8/1981 | Dawson |
| 4,319,213 A | 3/1982 | Reid |
| 4,357,588 A | 11/1982 | Leach et al. |
| 4,404,536 A | 9/1983 | Still |
| 4,413,221 A | 11/1983 | Benjamin et al. |
| 4,417,224 A | 11/1983 | Ross |
| 4,479,105 A | 10/1984 | Banes |
| 4,486,734 A | 12/1984 | Leach |
| 4,626,817 A | 12/1986 | Cameron |
| 4,661,807 A | 4/1987 | Panaro |
| 4,689,597 A | 8/1987 | Galloway et al. |
| 4,741,692 A | 5/1988 | Sadakata et al. |
| 4,751,489 A | 6/1988 | Spaunhorst et al. |
| 4,771,260 A | 9/1988 | Gurevich |
| 4,869,972 A | 9/1989 | Hatagishi |
| 4,893,106 A | 1/1990 | Goldstein et al. |
| 4,924,203 A | 5/1990 | Gurevich |
| 4,951,026 A | 8/1990 | Ehlmann |
| 4,972,170 A | 11/1990 | Ehlmann et al. |
| 4,994,779 A | 2/1991 | Douglass |
| 4,998,086 A | 3/1991 | Kourinsky et al. |
| 5,086,285 A | 2/1992 | Arikawa et al. |
| 5,134,253 A | 7/1992 | Doubrava |
| 5,148,140 A | 9/1992 | Goldstein |
| 5,153,802 A | 10/1992 | Mertz et al. |
| 5,237,875 A | 8/1993 | de la Veaux |
| 5,247,274 A | 9/1993 | Gurevich |
| 5,252,942 A | 10/1993 | Gurevich |
| 5,270,679 A | 12/1993 | Gulbrandsen |
| 5,296,832 A | 3/1994 | Perreault et al. |
| 5,418,487 A | 5/1995 | Armstrong, II |
| 5,426,411 A | 6/1995 | Pimpis et al. |
| 5,453,696 A | 9/1995 | Becker et al. |
| 5,519,561 A | 5/1996 | Mrenna et al. |
| 5,520,055 A | 5/1996 | Fussinger |
| 5,541,516 A | 7/1996 | Rider et al. |
| 5,604,474 A | 2/1997 | Leach et al. |
| 5,635,841 A | 6/1997 | Taylor |
| 5,670,926 A | 9/1997 | Ranjan et al. |
| 5,712,610 A | 1/1998 | Takeich et al. |
| 5,714,923 A | 2/1998 | Shea et al. |
| 5,731,733 A | 3/1998 | Denham |
| 5,736,918 A | 4/1998 | Douglass |
| 5,770,994 A | 6/1998 | Evans |
| 5,831,507 A | 11/1998 | Kasamatsu et al. |
| 5,831,509 A | 11/1998 | Elms et al. |
| 5,896,059 A | 4/1999 | Durham et al. |
| 5,903,208 A | 5/1999 | Sorger |
| 6,054,330 A | 4/2000 | Phipps et al. |
| 6,114,856 A | 9/2000 | Bitts |
| 6,225,809 B1 | 5/2001 | Watano et al. |
| 6,346,845 B1 | 2/2002 | Choi |
| 6,424,035 B1 | 7/2002 | Sapp et al. |
| 6,492,747 B1 | 12/2002 | Hoffmann |
| 6,498,526 B2 | 12/2002 | Lim et al. |
| 6,507,265 B1 | 1/2003 | Ackermann et al. |
| 6,541,983 B2 | 4/2003 | Khoury |
| 6,583,977 B1 | 6/2003 | Oglesbee |
| 6,590,490 B2 | 7/2003 | Ackermann |
| 6,642,833 B2 | 11/2003 | Ranjan et al. |
| 6,664,000 B1 | 12/2003 | Sonobe |
| 6,670,843 B1 | 12/2003 | Moench et al. |
| 6,686,744 B1 | 2/2004 | Tinsley |
| 6,806,107 B1 | 10/2004 | Wu |
| 6,987,396 B2 | 1/2006 | Yang et al. |
| 7,098,721 B2 | 8/2006 | Ouellette et al. |
| 7,109,877 B2 | 9/2006 | Cuk |
| 7,119,603 B2 | 10/2006 | Newman |
| 7,153,712 B1 | 12/2006 | Sidhu et al. |
| 7,170,299 B1 | 1/2007 | Anand et al. |
| 7,190,629 B2 | 3/2007 | Pan et al. |
| 7,205,746 B2 | 4/2007 | Batson |
| 7,215,175 B1 | 5/2007 | Mandal et al. |
| 7,295,057 B2 | 11/2007 | Bhushan et al. |
| 7,376,036 B2 | 5/2008 | Ueda |
| 7,400,482 B2 | 7/2008 | Parker |
| 7,518,899 B2 | 4/2009 | Perry et al. |
| 7,573,273 B2 | 8/2009 | Yanagida |
| 7,576,635 B2 | 8/2009 | Bender et al. |
| 7,609,577 B2 | 10/2009 | Anand et al. |
| 7,733,096 B2 | 6/2010 | Lin et al. |
| 7,791,972 B2 | 9/2010 | Ouelette et al. |
| 7,969,275 B2 | 6/2011 | Hartzog |
| 7,978,493 B1 | 7/2011 | Tan et al. |
| 8,030,181 B2 | 10/2011 | Chung et al. |
| 8,031,453 B2 | 10/2011 | Nelson et al. |
| 8,032,045 B2 | 10/2011 | Chae et al. |
| 8,035,943 B2 | 10/2011 | Turpin et al. |
| 8,036,005 B2 | 10/2011 | Gebert |
| 8,140,278 B2 | 3/2012 | Rodseth et al. |
| 8,189,362 B2 | 5/2012 | Tan et al. |
| 8,207,783 B2 | 6/2012 | Liao et al. |
| 8,208,336 B2 | 6/2012 | Do |
| 8,213,256 B2 | 7/2012 | Kim et al. |
| 8,265,506 B2 | 9/2012 | Young-min et al. |
| 8,349,665 B2 | 1/2013 | Kim |
| 8,351,291 B2 | 1/2013 | Lee et al. |
| 8,400,745 B1 | 3/2013 | Zansky et al. |
| 8,427,857 B2 | 4/2013 | Chen et al. |
| 8,587,912 B2 | 11/2013 | Jezierski et al. |
| 8,686,596 B2 | 4/2014 | Huss et al. |
| 8,724,280 B2 | 5/2014 | Andersson et al. |
| 8,762,083 B2 | 6/2014 | Rodseth et al. |
| 8,804,448 B2 | 8/2014 | Park et al. |
| 8,929,046 B2 | 1/2015 | Cyuzawa et al. |
| 8,953,294 B2 | 2/2015 | Graf et al. |
| 8,964,444 B2 | 2/2015 | Hall et al. |
| 9,006,794 B1 | 4/2015 | Xie et al. |
| 2002/0101323 A1 | 8/2002 | Ranjan et al. |
| 2005/0083167 A1 | 4/2005 | Ackermann |
| 2005/0258944 A1 | 11/2005 | Ozawa et al. |
| 2005/0280405 A1 | 12/2005 | Bray |
| 2006/0119465 A1 | 6/2006 | Dietsch |
| 2007/0159291 A1 | 7/2007 | Wilniewczyc et al. |
| 2007/0218258 A1 | 9/2007 | Nees et al. |
| 2007/0278617 A1 | 12/2007 | Okada et al. |
| 2008/0174928 A1 | 7/2008 | Liu et al. |
| 2008/0204961 A1 | 8/2008 | O'Leary et al. |
| 2008/0242150 A1 | 10/2008 | Chikamatsu et al. |
| 2008/0297303 A1 | 12/2008 | Tabatowski-Bush et al. |
| 2009/0108980 A1 | 4/2009 | Whitney et al. |
| 2009/0224323 A1 | 9/2009 | Im et al. |
| 2009/0256235 A1 | 10/2009 | Takaoka et al. |
| 2010/0023286 A1 | 1/2010 | Rodseth et al. |
| 2010/0164677 A1 | 7/2010 | Yang |
| 2010/0188187 A1 | 7/2010 | Mughal et al. |
| 2010/0283491 A1 | 11/2010 | Zurek et al. |
| 2011/0026177 A1 | 2/2011 | Atluri et al. |
| 2011/0140902 A1 | 6/2011 | Huss et al. |
| 2011/0279218 A1 | 11/2011 | Salonga et al. |
| 2011/0291481 A1 | 12/2011 | Matsumoto et al. |
| 2012/0127621 A1 | 5/2012 | Knapp, Jr. et al. |
| 2013/0211751 A1 | 5/2013 | Park et al. |
| 2014/0012520 A1 | 1/2014 | Zhao et al. |
| 2014/0055899 A1 | 2/2014 | Gruber |
| 2014/0062492 A1 | 3/2014 | Boxshall et al. |
| 2014/0087600 A1 | 3/2014 | Von Zur Muehlen et al. |

(56) References Cited

U.S. PATENT DOCUMENTS

| | | |
|---|---|---|
| 2014/0191772 A1 | 7/2014 | Hetzler |
| 2014/0209692 A1 | 7/2014 | Ozaki |
| 2014/0247057 A1 | 9/2014 | Rodseth et al. |
| 2014/0300183 A1 | 10/2014 | Trathnigg |
| 2014/0353796 A1 | 12/2014 | Lavoie et al. |
| 2014/0369105 A1 | 12/2014 | Lin et al. |
| 2015/0009008 A1 | 1/2015 | Luna |
| 2015/0151740 A1 | 6/2015 | Hynes et al. |
| 2015/0348732 A1 | 12/2015 | Douglass et al. |
| 2015/0348791 A1 | 12/2015 | Douglass et al. |
| 2015/0357144 A1 | 12/2015 | Pal |
| 2016/0229186 A1 | 8/2016 | Kanegae |
| 2016/0299186 A1* | 10/2016 | Fan ................. G01R 31/74 |
| 2016/0327593 A1 | 11/2016 | Labbe |
| 2016/0330216 A1 | 11/2016 | Kishinevsky et al. |
| 2017/0023618 A1 | 1/2017 | Douglass et al. |
| 2017/0047758 A1 | 2/2017 | Chatroux et al. |
| 2017/0122988 A1 | 5/2017 | Kothekar et al. |
| 2017/0179548 A1 | 6/2017 | Lee et al. |
| 2017/0199248 A1 | 7/2017 | Lee et al. |
| 2017/0363674 A1 | 12/2017 | Douglass et al. |
| 2018/0108507 A1 | 4/2018 | Brown et al. |

FOREIGN PATENT DOCUMENTS

| | | |
|---|---|---|
| DE | 102004002360 A1 | 8/2005 |
| DE | 202009002852 U1 | 7/2009 |
| DE | 102012209138 A1 | 12/2013 |
| DE | 102012014969 A1 | 1/2014 |
| DE | 102012224223 A1 | 7/2014 |
| DE | 102014014469 A1 | 3/2015 |
| DE | 102016106361 A1 | 10/2016 |
| EP | 0342101 A1 | 11/1989 |
| EP | 0962953 A2 | 12/1999 |
| EP | 0962953 B1 | 8/2005 |
| EP | 1536537 B1 | 1/2012 |
| EP | 2608243 A1 | 6/2013 |
| FR | 2689677 A1 | 10/1993 |
| GB | 674973 A | 7/1952 |
| GB | 1555278 A | 11/1979 |
| GB | 2280960 A | 2/1995 |
| JP | 53115053 A | 10/1978 |
| JP | 581942 A | 1/1983 |
| JP | 0389864 A | 4/1991 |
| JP | S61224233 A | 11/1991 |
| JP | 0757613 A | 3/1995 |
| JP | 7057613 A | 3/1995 |
| JP | 7057613 B2 | 6/1995 |
| JP | 2000295777 A | 10/2000 |
| JP | 2005197104 A | 7/2005 |
| JP | 2007043860 A | 2/2007 |
| JP | 4272044 B2 | 6/2009 |
| JP | 2011060687 A | 3/2011 |
| JP | 2011061886 A | 3/2011 |
| JP | 4772833 B2 | 9/2011 |
| JP | 20147134 A | 1/2014 |
| JP | 2014054102 A | 3/2014 |
| KR | 20080015215 A | 2/2008 |
| KR | 2008046510 A | 5/2008 |
| KR | 2013024244 A | 3/2013 |
| WO | 0131311 A1 | 5/2001 |
| WO | 2001031311 A2 | 5/2001 |
| WO | 2006002446 A2 | 1/2006 |
| WO | 2010055430 A1 | 5/2010 |
| WO | 2010061047 A1 | 6/2010 |
| WO | 2011102777 A1 | 8/2011 |
| WO | 2013167127 A1 | 11/2013 |
| WO | 2014037787 A2 | 3/2014 |
| WO | 2015057504 A1 | 4/2015 |
| WO | 2015183805 A1 | 12/2015 |

OTHER PUBLICATIONS

International Preliminary Report on Patentability for International Application PCT/US2016/055708, dated May 17, 2018, 13 pages.

International Search Report and Written Opinion for International Application No. PCT/US2017/029763, dated Jul. 27, 2017, 15 pages.

International Search Report and Written Opinion for International Application No. PCT/US2017/029774, dated Jul. 21, 2017, 16 pages.

Kuhnel Christian et al. "Investigations on the long-term behavior and switching function of fuse-elements for NH-fuse-links (gG) at higher thermal stress", 2017 6th International Youth Conference on Energy (IYCE), IEEE, Jun. 21, 2017 (Jun. 21, 2017), pp. 1-8.

Japanese Office Action for related Application No. 2016562236, dated Nov. 27, 2019, 19 Pages.

Extended European Search Report for Application No. 15799136.5, dated Jan. 16, 2018, 9 pages.

EV Fuse; https://www.pecj.ca.jp/fuse/files/PEC_Fuse_Catalogue_en_2019.pdf; Pacific Engineering Corporation; retrieved from Internet Nov. 12, 2020; 12 pages.

International Search Report of International Application No. PCT/US2015/032422, dated Dec. 3, 2015, 3 pages.

European Search Report and Written Opinion of Application No. 19177452.0, dated Oct. 21, 2019, 8 pages.

European Search Report and Written Opinion of Application No. 19177451.2, dated Oct. 24, 2019, 12 pages.

* cited by examiner

MONITORING SYSTEMS AND METHODS FOR ESTIMATING THERMAL-MECHANICAL FATIGUE IN AN ELECTRICAL FUSE

BACKGROUND OF THE INVENTION

The field of the invention relates generally to electrical power distribution systems, and more specifically to systems and methods for estimating a temperature of a fuse element having a non-linear resistance in an electrical circuit for the purpose of estimating thermal-mechanical fatigue in the fuse element.

Fuses are widely used as overcurrent protection devices to prevent costly damage to electrical circuits. Fuse terminals typically form an electrical connection between an electrical power source or power supply and an electrical component or a combination of components arranged in an electrical circuit. One or more fusible links or elements, or a fuse element assembly, is connected between the fuse terminals, so that when electrical current flow through the fuse and/or temperature of the fuse exceeds a predetermined limit, the fusible elements melt and opens one or more circuits through the fuse to prevent electrical component damage.

In many electrical power systems for electric-powered vehicles and other electrical systems fuse failure as a result of a thermal-mechanical fatigue process can either be a nuisance or an emergency. In view of the expanding use of electric-powered vehicles and other electronic systems, affordable fuse use monitoring systems and methods that can evaluate a thermal condition, and therefore fatigue, of an electrical fuse and predict or estimate a remaining service life of the fuse toward the goal of replacing a thermal cycle fatigued fuse before it fails from the fatigue process are desired to meet the needs of the marketplace.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

FIG. 1 illustrates an exemplary current profile that an electrical power fuse may be subjected to.

FIG. 4 illustrates a first exemplary performance of the technique illustrated in FIG. 3, wherein FIG. 4 illustrates a first plot of deduced current versus time in the exemplary fuse element.

FIGS. 5A, 5B, and 5C represent an exemplary performance of an exemplary temperature estimation technique according to an embodiment of the present invention based on the plot of deduced current versus time illustrated in FIG. 4, wherein FIG. 5A illustrates a plot of a calculated first temperature differential versus time and a plot of an estimated first temperature differential versus time, wherein FIG. 5B illustrates a plot of a calculated second temperature differential versus time and a plot of an estimated second temperature differential versus time, and wherein FIG. 5C illustrates a plot of calculated fuse element temperature versus time and a plot of estimated fuse element temperature versus time.

FIG. 6 illustrates a second exemplary performance of the technique illustrated in FIG. 3, wherein FIG. 6 illustrates a second plot of deduced current versus time in the exemplary fuse element.

FIGS. 7A, 7B, and 7C represent an exemplary performance of the exemplary temperature estimation technique according to an embodiment of the present invention based on the plot of deduced current versus time illustrated in FIG. 6, wherein FIG. 7A illustrates a plot of a calculated first temperature differential versus time and a plot of an estimated first temperature differential versus time, wherein FIG. 7B illustrates a plot of a calculated second temperature differential versus time and a plot of an estimated second temperature differential versus time, and wherein FIG. 7C illustrates a plot of calculated fuse element temperature versus time and a plot of estimated fuse element temperature versus time.

FIG. 8A illustrates a third exemplary performance of the technique illustrated in FIG. 3, wherein FIG. 8A illustrates a third plot of deduced current versus time in the exemplary fuse element and FIG. 8B represents an exemplary performance of an exemplary temperature estimation technique according to an embodiment of the present invention based on the plot of deduced current versus time illustrated in FIG. 8A wherein FIG. 8B illustrates a plot of calculated fuse element temperature versus time and a plot of estimated fuse element temperature versus time.

FIG. 9A illustrates a fourth exemplary performance of the technique illustrated in FIG. 3, wherein FIG. 9A illustrates a fourth plot of deduced current versus time in the exemplary fuse element and FIG. 9B represents an exemplary performance of an exemplary temperature estimation technique according to an embodiment of the present invention based on the plot of deduced current versus time illustrated in FIG. 9A wherein FIG. 9B illustrates a plot of calculated fuse element temperature versus time and a plot of estimated fuse element temperature versus time.

FIG. 10A illustrates a fifth exemplary performance of the technique illustrated in FIG. 3, wherein FIG. 10A illustrates a fifth plot of deduced current versus time in the exemplary fuse element and FIG. 10B represents an exemplary performance of an exemplary temperature estimation technique according to an embodiment of the present invention based on the plot of deduced current versus time illustrated in FIG. 10A wherein FIG. 10B illustrates a plot of calculated fuse element temperature versus time and a plot of estimated fuse element temperature versus time.

FIG. 11A illustrates a sixth exemplary performance of the technique illustrated in FIG. 3, wherein FIG. 11A illustrates a sixth plot of deduced current versus time in the exemplary fuse element and FIG. 11B represents an exemplary performance of an exemplary temperature estimation technique according to an embodiment of the present invention based on the plot of deduced current versus time illustrated in FIG. 11A wherein FIG. 11B illustrates a plot of calculated fuse element temperature versus time and a plot of estimated fuse element temperature versus time.

DETAILED DESCRIPTION OF THE INVENTION

Figure 1:
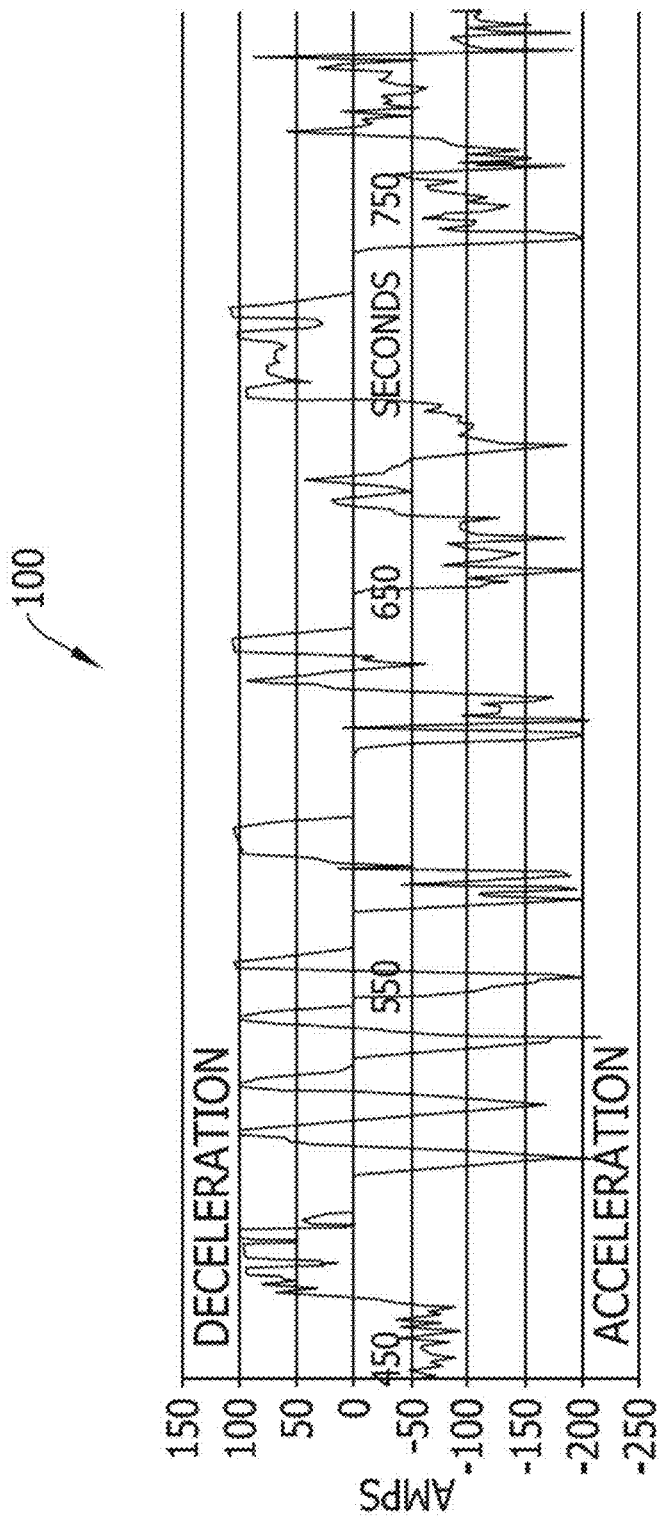

Recent advancements in electric vehicle technologies, among other things, present unique challenges to fuse manufacturers. Electric vehicle manufacturers are seeking fusible circuit protection for electrical power distribution systems operating at voltages much higher than conventional electrical power distribution systems for vehicles, while simultaneously seeking less costly fuses with effective temperature monitoring functionality to facilitate detection of impending failure conditions, for example, to meet electric vehicle specifications and demands.

Electrical power systems for conventional, internal combustion engine-powered vehicles operate at relatively low voltages, typically at or below about 48 VDC. Electrical power systems for electric-powered vehicles, referred to herein as electric vehicles (EVs), however, operate at much higher voltages. The relatively high voltage systems (e.g., 200 VDC and above) of EVs generally enables the batteries to store more energy from a power source and provide more energy to an electric motor of the vehicle with lower losses (e.g., heat loss) than conventional batteries storing energy at 12 volts or 24 volts used with internal combustion engines, and more recent 48 volt power systems.

EV original equipment manufacturers (OEMs) employ circuit protection fuses to protect electrical loads in all-battery electric vehicles (BEVs), hybrid electric vehicles (HEVs) and plug-in hybrid electric vehicles (PHEVs). Across each EV type, EV manufacturers seek to maximize the mileage range of the EV per battery charge while reducing cost of ownership. Accomplishing these objectives turns on the energy storage and power delivery of the EV system, as well as the cost, size, volume, and mass of the vehicle components that are carried by the power system. Smaller, more affordable, and/or lighter vehicles will more effectively meet these demands than larger, more expensive, and heavier vehicles, and as such all EV components are now being scrutinized for potential size, weight, and cost savings.

Generally speaking, more complex components with temperature monitoring systems tend to have higher associated material costs, higher finished component costs, and tend to increase the overall size of the EV of occupy an undue amount of space in a shrinking vehicle volume, and tend to introduce greater mass that directly reduces the vehicle mileage per single battery charge. Known high voltage circuit protection fuse incorporating some types of temperature monitoring are, however, relatively complex, expensive, and relatively large. Historically, and for good reason, circuit protection fuses have tended to increase in complexity, cost, and size to meet the demands of high voltage power systems as opposed to lower voltage systems. As such, existing fuses needed to protect high voltage EV power systems are much larger than the existing fuses needed to protect the lower voltage power systems of conventional, internal combustion engine-powered vehicles. Less complex, less expensive, and smaller high voltage power fuses incorporating temperature monitoring features are desired to meet the needs of EV manufacturers, without sacrificing circuit protection performance and reliability.

Electrical power systems for state of the art EVs may operate at voltages as high as 450 VDC. The increased power system voltage desirably delivers more power to the EV per battery charge. Operating conditions of electrical fuses in such high voltage power systems are much more severe, however, than lower voltage systems. Specifically, specifications relating to electrical arcing conditions as the fuse opens can be particularly difficult to meet for higher voltage power systems, especially when coupled with the industry preference for reduction in the size of electrical fuses. Current cycling loads, and resulting temperature cycling, imposed on power fuses by state of the art EVs also tend to impose mechanical strain and wear that can lead to premature failure of a conventional fuse element due to fuse element fatigue. While known power fuses incorporating temperature monitoring features are presently available for use by EV OEMs in high voltage circuitry of state of the art EV applications, the cost and complexity of conventional power fuses capable of providing temperature monitoring of the fuse element for EVs is impractically high for implementation in mass produced affordable EVs.

Providing relatively less expensive power fuses and temperature monitoring systems that can capably handle high current and high battery voltages of state of the art EV power systems, while still providing acceptable interruption performance as the fuse element operates at high voltages and temperature monitoring of at least the fuse element is challenging, to say the least. Fuse manufacturers and EV manufactures would each benefit from less expensive and less complex fuse temperature monitoring systems. While EV innovations are leading the markets desired for smaller, more affordable higher voltage fuses and temperature monitoring systems, the trend toward smaller, yet more powerful, electrical systems transcends the EV market. A variety of other power system applications would undoubtedly benefit from less complex and more affordable fuse element temperature monitoring systems. The demands imposed on electrical fuses by EV power system applications, however, presents particular challenges that may shorten a service life of the electrical fuses and that may result in unplanned downtime of the vehicle without additional monitoring systems to facilitate prediction of these failure events. Improvements are needed to longstanding and unfulfilled needs in the art.

Inventive systems and methods are disclosed below wherein monitoring the fatigue of the fuse is achieved at least in part by monitoring a fatigue parameter such as fuse element temperature or mechanical strain, and comparing the monitored parameter to known fatigue parameters for a similar fuse element to assess a state of fatigue and remaining service life of the fuse. Fatigue monitoring may also be achieved by monitoring fuse temperature, calculating a strain associated with peak fuse element temperatures in a cyclic current load, computing a fatigue damage component for each peak temperature, and accumulating the fatigue damage components over time to assess a state of fatigue and an associated remaining service life of the fuse.

FIG. 1 illustrates an exemplary current drive profile 100 in an EV power system application that can render a fuse, and specifically the fuse element or elements therein susceptible to load current cycling fatigue, at least partially due to temperature cycling. The current is shown along a vertical axis in FIG. 1 with time shown along the horizontal axis. In typical EV power system applications, power fuses are utilized as circuit protection devices to prevent damage to electrical loads from electrical fault conditions. Considering the example of FIG. 1, EV power systems are susceptible to large variances in current loads, and therefore large variances in temperature over relatively short periods of time. The variance in current produces current pulses of various magnitude in sequences produced by seemingly random driving habits based on the actions of the driver of the EV vehicle, traffic conditions and/or road conditions. This creates a practically infinite variety of current and temperature loading cycles on the EV drive motor, the primary drive battery, and any protective power fuse included in the system.

Such random current loading conditions, exemplified in the current pulse profile of FIG. 1, are cyclic in nature for both the acceleration of the EV (corresponding to battery drain) and the deceleration of the EV (corresponding to regenerative battery charging). This current cyclic loading imposes cyclic thermal stress on the fuse element, and more specifically in the so-called weak spots of the fuse element assembly in the power fuse, by way of a joule effect heating process. This cyclic thermal loading of the fuse element imposes mechanical expansion and contraction cycles on the fuse element weak-spots in particular. This repeated mechanical cyclic loading of the fuse element weak spots imposes an accumulating strain that damages the weak spots to the point of breakage in time. For the purposes of the present description, this thermal-mechanical process and phenomena is referred to herein as fuse fatigue. Fuse fatigue is attributable mainly to creep strain as the fuse endures the drive profile. Heat generated in the fuse element weak spots is the primary mechanism leading to the onset of fuse fatigue.

Described below are exemplary embodiments of systems and methods that facilitate a computationally-efficient and cost effective estimation of a temperature of a conductor having a non-linear resistance, such as an electrical fuse element. The systems and methods facilitate estimating temperatures experienced by the fuse element towards the goal of replacing a temperature cycle fatigued fuse before it fails as a result of repeated temperature and current cycles. This is achieved, as explained in detail below, by deducing (i.e., calculating and/or receiving) a current flow in the fuse element, receiving an ambient temperature, and applying a state-space model to the deduced current and ambient temperature to estimate the fuse element temperature. The system may accordingly provide alerts and notifications concerning a monitored temperature cycle count, record data and information concerning the same, communicate the data and information concerning the same, communicate the data and information to remote devices, and even recognize over temperature occurrences that may cause the fuse to open/fail prior to its standard expected service life. Method aspects will be in part apparent and in part explicitly discussed in the following description.

While the present invention is described in the context of EV applications generating a current profile such as that shown in FIG. 1, and while the invention is also described in the context of a particular type and rating of a fuse to meet the needs of the exemplary EV application, the benefits of the invention are not necessarily limited to EV applications or to the particular type or ratings described. Rather the benefits of the invention are believed to more broadly accrue to many different power system applications generating other current profiles. The invention can also be practiced in part or in whole to construct different types of fuses having similar or different ratings than those discussed herein. The EV current profile shown in FIG. 1 and the fuse described below are therefore discussed for the sake of illustration rather than limitation.

Figure 2:
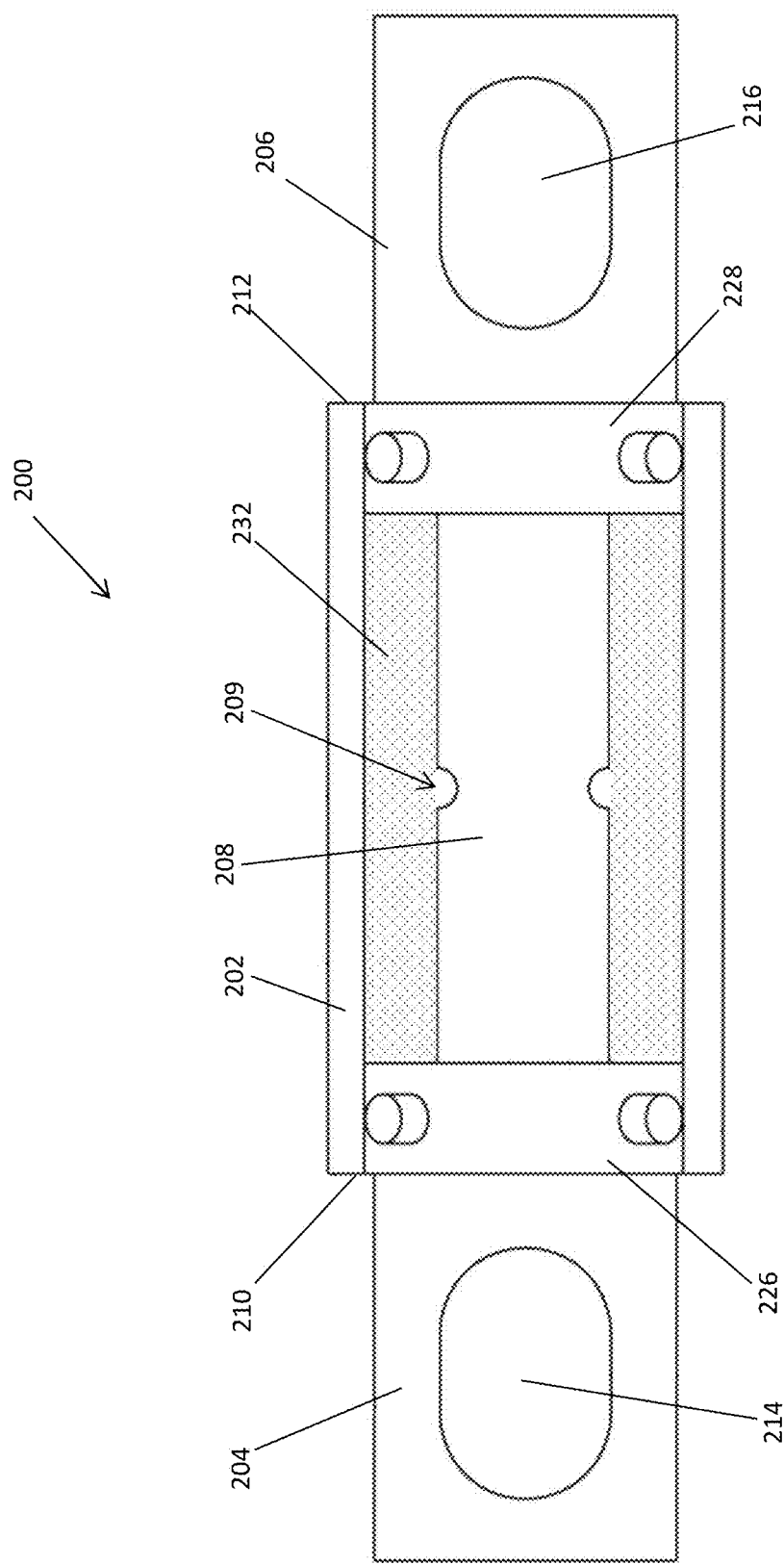
FIG. 2 is a top plan view of a high voltage power fuse that may experience the current profile shown in FIG. 1.

FIG. 2 is a top plan view of an exemplary high voltage power fuse 200 that may experience the current profile shown in FIG. 1 and that is designed for use with an EV power system. As shown in FIG. 2, the power fuse 200 of the invention includes a housing 202, terminal blades 204, 206 configured for connection to a line and a load side circuitry, and a fuse element 208 including a fuse element weak-spot 209 that completes an electrical connection between the terminal blades 204, 206. When subjected to predetermined current conditions, at least a portion of the fuse element 208 melts, disintegrates, or otherwise structurally fails and opens the circuit path between the terminal blades 204, 206. The load side circuitry is therefore electrically isolated from the line side circuitry to protect the load side circuit components and the circuit from damage when electrical fault conditions occur.

The fuse 200 in one example is engineered to provide a predetermined voltage rating and a current rating suitable for use in an electrical power system of an electric vehicle in a contemplated embodiment. In one example, the housing 202 is fabricated from a non-conductive material known in the art such as glass melamine in one exemplary embodiment. Other known materials suitable for the housing 202 could alternatively be used in other embodiments as desired. Additionally, the housing 202 shown is generally cylindrical or tubular and has a generally circular cross-section along an axis parallel to length of the terminal blades 204, 206 in the exemplary embodiment shown. The housing 202 may alternatively be formed in another shape if desired, however, including but not limited to a rectangular shape having four side walls arranged orthogonally to one another, and hence having a square or rectangular-shaped cross section. The housing 202 as shown includes a first end 210, a second end 212, and an internal bore or passageway between the opposing ends 210, 212 that receives and accommodates the fuse element 208.

In some embodiments the housing 202 may be fabricated from an electrically conductive material if desired, although this would require insulating gaskets and the like to electrically isolate the terminal blades 204, 206 from the housing 202.

Figure 3:
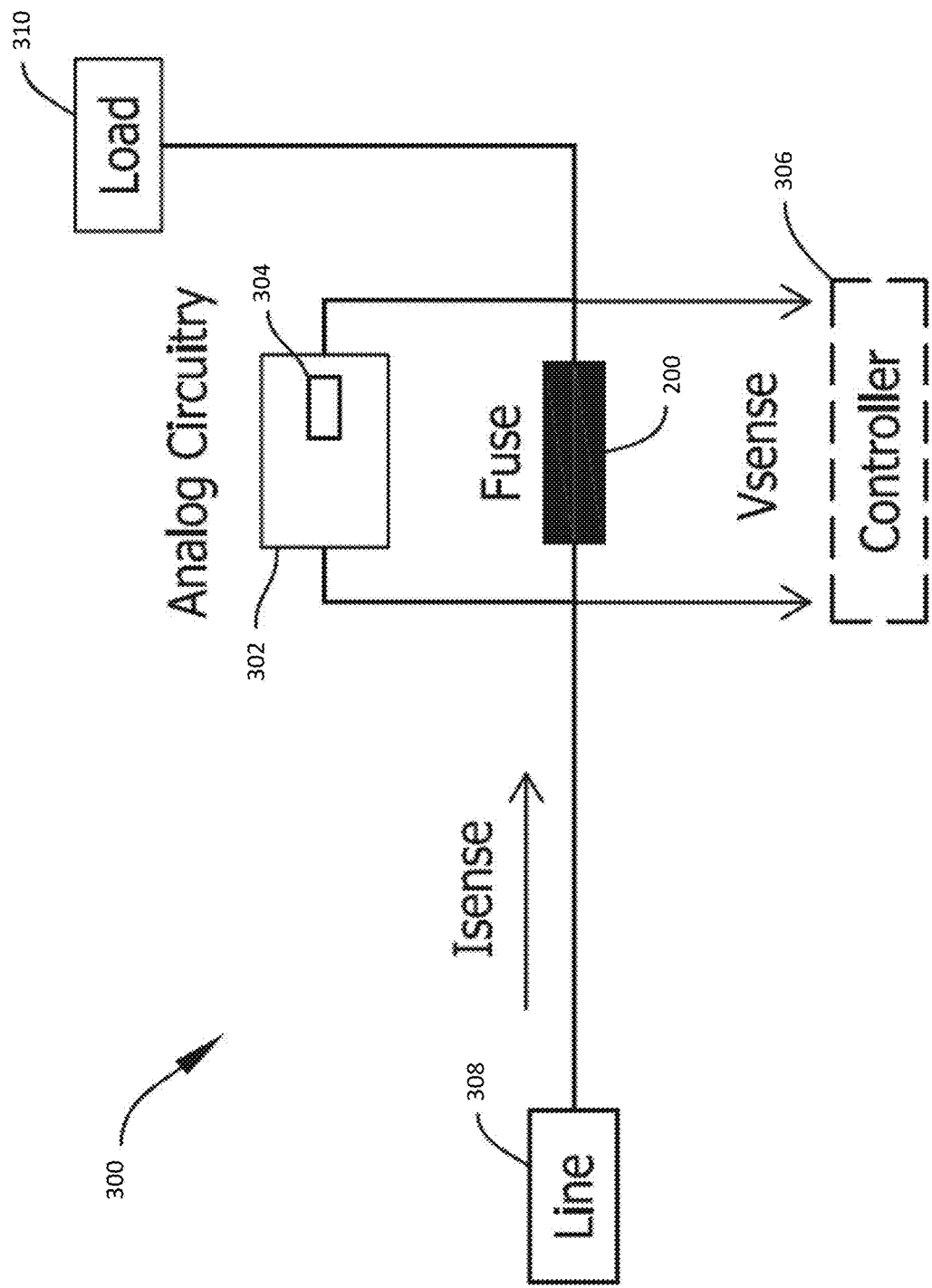
FIG. 3 is a partial circuit schematic of a portion of an electrical power system illustrating a first exemplary current sensing technique according to an embodiment of the present invention.

The terminal blades 204, 206 respectively extend in opposite directions from each opposing end 210, 212 of the housing 202 and are arranged to extend in a generally co-planar relationship with one another. Each of the terminal blades 204, 206 may be fabricated from an electrically conductive material such as copper or silver or suitable metal alloys in contemplated embodiments. Other known conductive materials may alternatively be used in other embodiments as desired to form the terminal blades 204, 206. Each of the terminal blades 204, 206 is formed with an aperture 214, 216 as shown in FIG. 3, and the apertures 214, 216 may receive a fastener such as a bolt (not shown) to secure the fuse 200 in place in an EV and establish line and load side circuit connections to circuit conductors via the terminal blades 204, 206.

While exemplary terminal blades 204, 206 are shown and described for the fuse 200, other terminal structures and arrangements may likewise be utilized in further and/or alternative embodiments. For example, the apertures 214, 216 may be considered optional in some embodiments and may be omitted. Knife blade contacts may be provided in lieu of the terminal blades as shown, as well as ferrule terminals or end caps as those in the art would appreciate to provide various different types of termination options. The terminal blades 204, 206 may also be arranged in a spaced apart and generally parallel orientation if desired and may project from the housing 202 at different locations than those shown.

In various embodiments, the end plates 226, 228 may be formed to include the terminal blades 204, 206 or the terminal blades 204, 206 may be separately provided and attached. The end plates 226, 228 may be considered optional in some embodiments and connection between the fuse element 208 and the terminal blades 204, 206 may be established in another manner.

An arc quenching medium or material 232 surrounds the fuse element 208. The arc quenching medium 232 may be introduced to the housing 202 via one or more fill openings in one of the end plates 226, 228 that are sealed with plugs (not shown). The plugs may be fabricated from steel, plastic or other materials in various embodiments. In other embodiments a fill hole or fill holes may be provided in other locations, including but not limited to the housing 202 to facilitate the introduction of the arc quenching medium 232.

In one contemplated embodiment, the arc quenching medium 232 includes quartz silica sand and a sodium silicate binder. The quartz sand has a relatively high heat conduction and absorption capacity in its loose compacted state, but can be silicated to provide improved performance. For example, by adding a liquid sodium silicate solution to the sand and then drying off the free water, silicate arc quenching medium 232 may be obtained with the following advantages.

The arc quenching medium 232 creates a thermal conduction bond of sodium silicate to the fuse element 208, the quartz sand, the fuse housing 202 and the end plates 226 and 228. This thermal bond allows for higher heat conduction from the fuse element 208 to its surroundings, circuit interfaces and conductors. The application of sodium silicate to the quartz sand aids with the conduction of heat energy out and away from the fuse element 208.

The sodium silicate mechanically binds the sand to the fuse element, terminal and housing tube increasing the thermal conduction between these materials. Conventionally, a filler material which may include sand only makes point contact with the conductive portions of the fuse element in a fuse, whereas the silicated sand of the arc quenching medium 232 is mechanically bonded to the fuse element. Much more efficient and effective thermal conduction is therefore made possible by the silicated arc quenching medium 232.

The fuse elements described in the fuse 200 utilize metal stamped or punched fuse elements, presenting some concern for EV applications including the type of cyclic current loads described above. Such stamped fuse element designs whether fabricated from copper or silver or copper alloys undesirably introduce mechanical strains and stresses on the fuse element weak-spots 209 such that a shorter service life tends to result than if the fuse 200 were used in another power system having a different current load. This short fuse service life manifests itself in the form of nuisance fuse operation resulting from the mechanical fatigue of the fuse element at the weak-spots 209.

In a contemplated system of the invention, the measurement of the fuse resistance may be made with precision by injecting a known current across the fuse element 208 as further described below. That is, the system may measure the non-linear fuse resistance while it is in service, and algorithms may be developed to assess the changes in resistance and estimate a temperature of the fuse element 208 based on the resistance of the fuse 200 and the ambient thermal conditions, as will be described further below.

FIG. 3 illustrates a first exemplary current sensing technique for an exemplary electrical power system 300 according to an embodiment of the present invention. The technique shown in FIG. 3 recognizes that the fuse 200, as are all electrical fuses, is essentially a calibrated resistor. Because a resistor drops a voltage during operation, knowing the voltage $V_{sense}$, the current $I_{sense}$ can be calculated using Ohms Law if fuse resistance $R_{fuse}$ is known. The voltage $V_{sense}$ across the fuse 200 does not allow a simple and direct determination of the current $I_{sense}$ using Ohm's law. This is because the fuse element 208 in the fuse 200 exhibits a non-linear resistance. That is, the resistance of the fuse element $R_{fuse}$ is subject to change in different operating conditions and as the resistance changes the detected voltage $V_{sense}$ will vary in a manner that does not always correlate with a change in current.

Compensation circuitry 302 is therefore provided to, among other things, iteratively detect at successive time periods the voltage $V_{sense}$, determine the resistance $R_{fuse}$ at each particular point in time, and calculate the current $I_{sense}$ using Ohm's law and/or predetermined relationships between voltage and resistance, temperature and current for the fuse element under certain operating conditions. Over time, changes in the fuse current $I_{sense}$ can be reliably determined from the detected fuse voltage $V_{sense}$ only, and effective current sensing may be realized without conventional current sensors such as those described above.

The compensation circuitry 302 may accordingly include a controller 304 that measures the fuse element voltage $V_{sense}$ at periodic intervals to account for variations in fuse resistance $R_{fuse}$, determines the fuse resistance $R_{fuse}$ at each periodic interval, and computes the current $I_{sense}$ based on the monitored voltage $V_{sense}$ and the determined resistance $R_{fuse}$. While the controller 304 is illustrated as part of the compensation circuitry 302, the controller may alternatively be provided elsewhere, including but not limited to in a sub-metering module (SMM) in, for example a combiner box including the fuse 200. That is, the controller 304 need not be a part of the compensation circuitry 302 itself in all embodiments, but instead may be separately provided.

The detected voltage $V_{sense}$ in some embodiments may optionally be input to another optional controller 306 at a local or remote location relative to the fuse 200 that calculates the current $I_{sense}$ in the manner described below. The controller 306 may be provided in addition to or in lieu of the controller 304. It is understood, however, that the functionality of the controllers 304, 306 shown may be combined into a single controller if desired. Regardless, one or both of the controllers 304, 306 may advantageously determine the resistance $R_{fuse}$ at any given point in time as explained below, and based on the determination of the resistance $R_{fuse}$ the current $I_{sense}$ can be computed using Ohm's law (i.e., $I_{sense}=V_{sense}/R_{fuse}$) while achieving a relatively smaller and more cost effective current sensing system than that shown in FIG. 1.

The controllers 304 and/or 306 may each be processor-based controllers. As used herein, the term "processor-based" shall refer not only to controllers including a processor or microprocessor, but also to other equivalent elements such as microcomputers, programmable logic controllers, reduced instruction set (RISC) circuits, application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based".

In lieu of or in addition to the controller 304, the compensation circuitry 302 may include a differential amplifier providing a direct or indirect voltage input to a processor-based device, or another voltage sensor or voltage sensor circuitry known in the art may be applied in the compensation circuitry 302 to detect the voltage $V_{sense}$ for purposes of calculating the current $I_{sense}$. The current calculation may be made in whole or in part within the compensation circuitry 302 or the compensation circuitry 302 may supply a voltage signal to another device to make the computation or complete the current computation.

In contemplated embodiments, algorithms are utilized by one or both of the controllers 304 or 306 to translate the non-linear response of the fuse element into calculated current readings. In the example, the fuse 200 is connected between line side circuitry 308 and load side circuitry 310. The calculated current readings are based upon an idealized performance of the fuse element at a steady state temperature equilibrium. Such idealized performance can be mathematically modeled using known relationships and/or experimentally established and verified for particular types and configurations of electrical fuses and fuse elements. The modeled performance can be expressed in graphical plots and/or mathematical relationships that can be utilized to calculate electrical current flowing through the fuse as changes in the voltage $V_{sense}$ are detected.

Since different fuse elements have their own unique and individual variables and properties, a scheme for coding these unique variables and properties with the applicable modeled relationships is required for proper and accurate translation of the resistor voltage to a calculated current. A coding scheme may include RFID tagging and or bar code labeling.

Those in the art will appreciate that the electronic circuitry proposed requires an appropriate isolation scheme to isolate the system voltage of the electrical power system 300 from the electronics. Once determined, current data can be transmitted to a remote location, via, for example, optical or wireless communication systems, although other types of communication are possible if desired. Prognostic and/or diagnostic capability is provided that enhances oversight, monitoring and control of an electrical power distribution system, using a comparatively low cost and simple architecture of the current sensing system.

As described in detail below, contemplated embodiments simply and directly measure the voltage drop $V_{sense}$ across the fuse 200 at a predetermined frequency such as 20 Hz and, based on the measured voltage drop and prior characterization of the fuse via applied relationships of the fuse under idealized conditions, compute the current that causes the measured voltage drop. Advantageously, the current sensing architecture can be achieved at relatively low cost while providing sufficient accuracy for certain applications where only telemetry accuracy is required instead of high precision.

The current sensing techniques described thus far are premised on an idealized assumption that, while a fuse element typically exhibits a non-linear resistance when connected to energized electrical circuitry, a resistance of the fuse element is linearly dependent on temperature in certain operating conditions. With a focus toward these operating conditions, such linear dependence on temperature provides a basis to easily determine a resistance of the fuse element at those conditions, and in turn, calculate the current $I_{sense}$ at any desired point in time. In actuality, the idealized assumption behind the determination of fuse resistance and calculated current may or may not be realized, but nonetheless current can still be computed accurately in many instances as demonstrated further below.

Considering a well-known type of the fuse element 208 such as a conductive strip of metal (e.g., a copper strip) having one or more weak spots or areas of reduced cross sectional area, the idealized assumption of linear resistance and temperature at first glance may appear to be inappropriate. For example, copper has a temperature co-efficient of 0.0038 and applying this coefficient one may expect a resistance of the fuse element to change by about 23% across a 60° C. temperature differential assuming that resistance actually does change linearly with temperature. However, in reality this assumption may amount to around 0.38% error per ° C. in conditions wherein the fuse element simply does not follow the assumed behavior.

The system 300 and methods described are easiest to implement and are more accurate in electrical power systems having relatively stable current load, but is more difficult in an EV power system having a random-type cyclic current pulse profile such as that shown in FIG. 1. Nonetheless, the system 300 and methods may be useful to provide estimations of the current flowing through the fuse 200 for use in calculating the temperature of the fuse element 208 in an EV power system as will be described below. Data collected by the system 300 may be beneficially used to refine algorithms to increase the accuracy of the resistance and temperature assessment made.

While the concepts described are illustrated in the context of calculating or otherwise deducing current in order to estimate at least the temperature of the fuse element 208 of the fuse 200, the concepts illustrated in FIG. 3 could alternatively be applied to other conductive elements besides a fuse. The use of circuit elements like fuses, circuit breaker contacts, electrical connections and all other components that introduce series resistance into the circuit in order to estimate a thermal condition of a component can be effectively applied with an accompanying compensation circuit operating. Since each circuit element used for current sensing can have its own unique and individual variables and properties, a scheme for coding these unique variables and properties with the circuit element is required for proper and accurate translation of the resistor voltage to a calculated current and finally to an estimated temperature of the component based on the calculated current and the ambient temperature for the purpose of estimating fatigue in the fuse element, as described in detail below.

Determining a temperature of the fuse element 208 to more accurately assess fatigue can be difficult given the size and operational constraints of a typical EV fuse. Calculating the temperature of the fuse element during operation of the EV can be accomplished with various computational systems, such as ANSYS®, but the analysis can be computationally intensive and can require substantial computing power to solve trigonometric operations and generate calculated temperatures for the fuse element 208. The following algorithms, and techniques of performing the algorithms, represent a relatively computationally light way to estimate and model the thermal condition of the fuse element 208.

In contemplated embodiments, the algorithms are utilized by one or both of the controllers 304 and 306 to translate the calculated current readings and the ambient temperature of the fuse 200 into estimated temperatures for the fuse element 208 during operational use. In a contemplated embodiments, one or both of the controllers 304 and 306 may deduce the calculated current readings, wherein at least one of the controllers 304 and 306 may at least one of calculate the current flowing through the fuse 200 and receive the calculated current readings from at least one other controller. In contemplated embodiments, one or both of the controllers 304 and 306 may receive current readings from any other component that facilitates estimation of the temperature, and therefore thermal fatigue, of the fuse element 208 as described herein.

To estimate the temperature of the fuse element 208 in real-time, a series of algorithms based on state-space modeling are utilized by at least one of the controllers 304 and 306. The series of algorithms can be used to estimate the fuse element 208 temperature based on a deduced current in the fuse element 208 and an ambient temperature of the environment in which the fuse 200 is located. Estimation of the temperature of the fuse element 208 includes deducing (i.e., calculating or receiving) the current in the fuse element 208 and the ambient temperature at the location of the fuse 200, estimating a first temperature differential between the fuse element 208 and the arc quenching medium 232, estimating a second temperature differential between the arc quenching medium 232 and the ambient temperature, and finally, adding the first temperature differential, the second temperature differential, and the ambient temperature together to calculate the estimated temperature of the fuse element 208.

Figure 4:
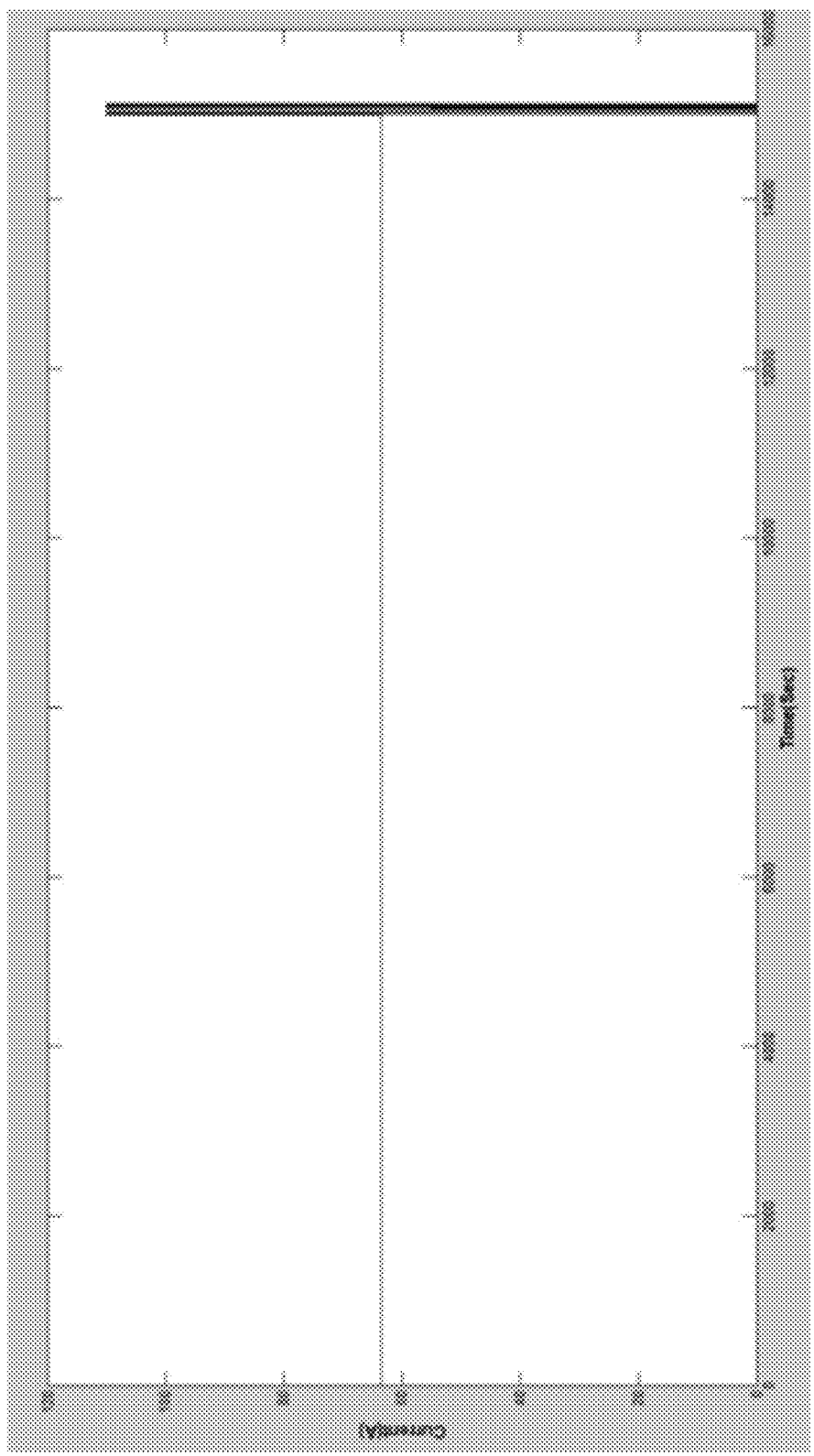
Figure 5A:
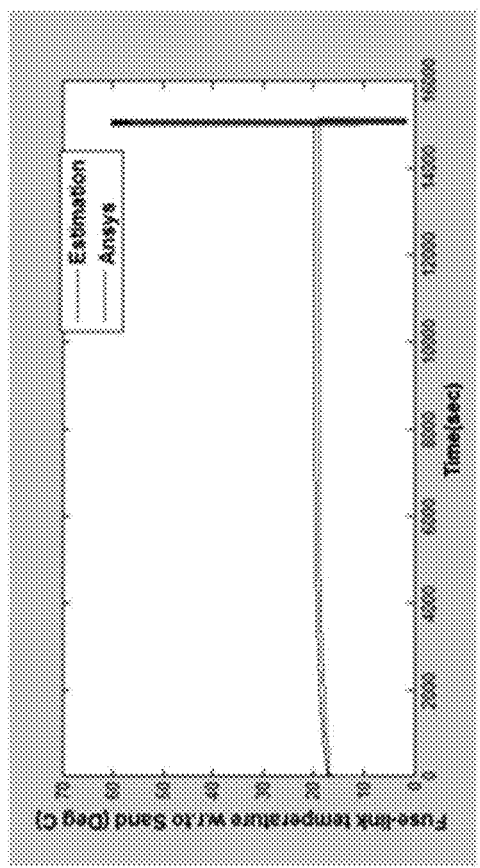
Figure 5B:
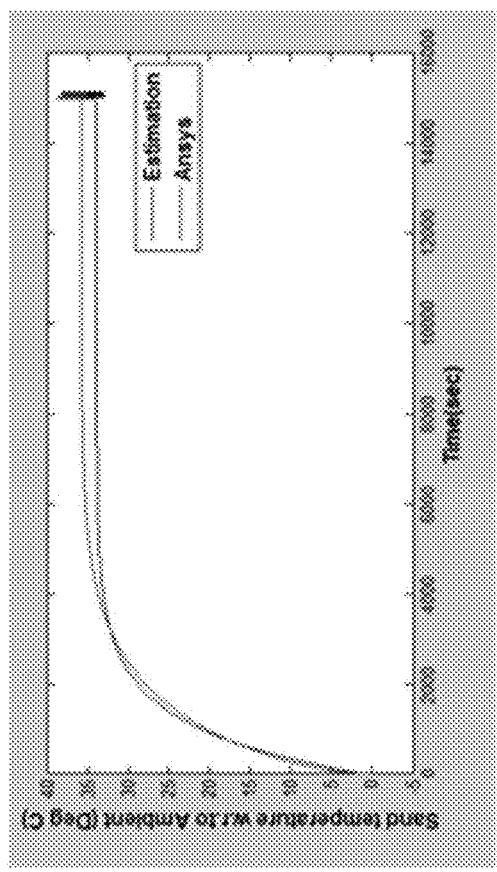
Figure 5C:
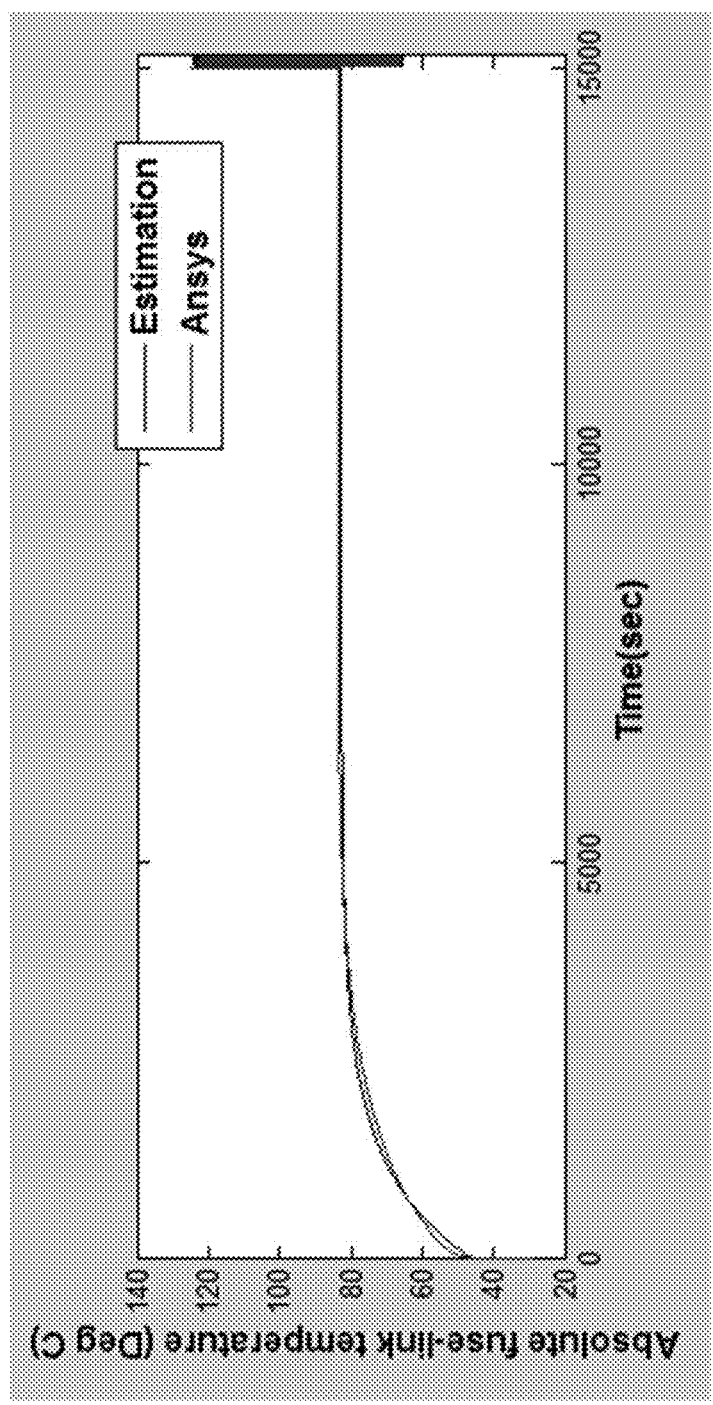

FIG. 4 illustrates a first exemplary performance of the technique illustrated in FIG. 3, wherein FIG. 4 illustrates a first plot of deduced current versus time in the fuse element 208. Based on the deduced current in the fuse element, as illustrated in FIG. 4, and the ambient temperature of the fuse 200, FIGS. 5A, 5B, and 5C represent an exemplary performance of an exemplary temperature estimation technique according to an embodiment of the present invention. Once the current flowing through fuse 200 is determined using the technique illustrated in FIG. 3, the deduced current and the ambient temperature are used to estimate the temperature of the fuse element 208 using the algorithms that are described in further detail below.

In a first contemplated temperature estimation technique example, the temperature of the fuse element 208 can be estimated by using a transfer function in the Z-domain. The first temperature differential can be estimated for a varying current situation through the use of the following equation: where $T_{fuse\_sand}(i)$, is the first temperature differential between the fuse element and the arc quenching medium, or sand, and T is the ambient temperature. The first temperature differential for a constant current application as shown in FIG. 4 can be estimated as follows for the exemplary arc quenching medium 232 and fuse 200 (FIG. 2):

$$T_{fuse\_sand}(i) = \frac{\left(0.002398 + 0.001 * \frac{(T-21)}{64}\right)z - (0.001692)}{z^2 - \left(0.8131 - 0.12 * \frac{(T-21)}{64}\right)z}$$

where $T_{fuse\_sand}(i)$ is the first temperature differential for the constant current application and T is the ambient temperature.

Using the above temperature estimation technique, calculating the second temperature differential between the arc quenching 232 medium and the ambient temperature can be estimated using a transfer function in the Z-domain as follows for the exemplary arc quenching material 232 and fuse 200:

$$T_{sand\_ambient}(i) = \frac{\left(1.159 - 0.0095 * \frac{T-21}{64}\right) * 10^{-5} * z^2 - 1.147 * 10^{-5} * z}{Z^4 - 0.6808 * z^3 + \left(2.3386 + 0.008 * \frac{T-21}{64}\right)z^2 - \left(2.65778 + \left(0.008 * \frac{T-21}{64}\right)\right)z}$$

where $T_{sand\_ambient}(i)$ is the second temperature differential, and T is the ambient temperature. Finally, the temperature of the fuse element 208 may be estimated, as a result of using the above transfer functions in the Z-domain, by adding the first temperature differential and the second temperature differential to the ambient temperature.

In another contemplated temperature estimation technique example, the temperature of the fuse element 208 can be estimated in the time domain using a series of algorithms to estimate the first temperature differential and the second temperature differential in a variable current condition. The first temperature differential can be estimated as follows for an exemplary arc quenching medium 232 and the fuse 200 (FIG. 4):

$$T_{fuse\_sand}(i) = \begin{cases} \left(0.8131 - 0.12 * \frac{(T-21)}{64}\right) * T_f(i-1.1) + \\ \quad \left(0.002398 + 0.001 * \frac{(T-21)}{64}\right) * & t = 1 \text{ sec} \\ \quad I(i)^2 - 0.001692 * I(i-1)^2 \\ I(i)^{2.35} * 0.0075 * \left(1 + 1.1 * \frac{T-21}{9*64}\right) & t = 5 \text{ sec} \\ I(i)^{2.35} * 0.0009 * \left(1 + 1.1 * \frac{T-21}{9*64}\right) & t = 10 \text{ sec} \\ I(i)^{2.35} * 0.001 * \left(1 + 1.1 * \frac{T-21}{9*64}\right) & t = 50 \text{ sec} \\ T_f(50) & 50 < t \le 100 \\ I(i)^{2.35}(T_f(50) + (0.00115 * \\ \left(1 + 1.1 * \frac{T-21}{9*64}\right) - T_f(50) * \left(1 - e^{\frac{-(t-100)}{2200}}\right) & 100 < t \le \infty \end{cases}$$

where $T_{fuse\_sand}(i)$ is the first temperature differential, i is the time instant of drive profile, t is the time duration of constant current, and T is the ambient temperature.

Using the preceding temperature estimation technique, the second temperature differential, in the time domain, can be estimated using the following equation:

$$T_{sand\_ambient}(i) = \left(2.65778 + \left(0.008 * \frac{T-21}{64}\right)\right) * T_{sand}(i-1) -$$
$$\left(2.3386 + 0.008 * \frac{T-21}{64}\right) * T_{sand}(i-2) + 0.6808 * T_{sand}(i-3) +$$
$$\left(1.159 - 0.0095 * \frac{T-21}{64}\right) * 10^{-5} * I(i-2)^2 - 1.147 * 10^{-5} * I(i-1)^2)$$

where $T_{sand\_ambient}(i)$ is the second temperature differential, and T is the ambient temperature. Finally, the temperature of the fuse element 208 may be estimated, as a result of using the above time domain algorithms, by adding the first temperature differential and the second temperature differential to the ambient temperature as follows:

$$T_{Fuse}(i) = T_{fuse\_sand}(i) + T_{sand\_ambient}(i) + T$$

The relationships and calculations may be repeated at any desired time interval to monitor the temperature of the fuse element 208 over time.

The performances of the algorithms described above are shown in FIGS. 5A, 5B, and 5C based on the plot of the deduced current versus time shown in FIG. 4. More specifically, FIG. 5A illustrates a plot of a calculated first temperature differential versus time and a plot of an estimated first temperature differential versus time, FIG. 5B illustrates a plot of a calculated second temperature differential versus time and a plot of an estimated second temperature differential versus time, and FIG. 5C illustrates a plot of calculated fuse element temperature versus time and a plot of estimated fuse element temperature versus time.

Each of the estimated plots illustrated by one of a respective FIGS. 5A, 5B, and 5C illustrates a performance of at least one of the algorithms using the techniques described above.

As can be seen in FIG. 4, the plot of the deduced current indicates that the rate of current flow through the fuse 200 is substantially constant. Based on the deduced current and the ambient temperature of the fuse 200, the estimated first temperature differential for the substantially-constant current situation is estimated by performing the technique and algorithms described above, and the resulting estimated first temperature differential between a temperature of the fuse element 208 and a temperature of the arc quenching medium 232 is plotted as shown in FIG. 5A. As illustrated in FIG. 5A, the plot of the estimated first temperature differential closely follows the plot of the calculated first temperature differential that was generated using a calculation-intensive process, such as ANSYS. In this example, the estimated first temperature differential slowly increases until a thermal equilibrium condition is reached approximately halfway through the measurement window, indicating that the arc quenching medium 232 rapidly reaches a steady-state thermal condition relative to the fuse element 208 during operation of the fuse 200 while the fuse element 208 is receiving a substantially constant rate of current flow. Additionally, the estimated temperature differential increases from the initial condition to the thermal equilibrium condition by a relatively small amount, indicating that the arc quenching medium is a relatively good conductor of thermal energy.

FIG. 5B illustrates the plot of the estimated second temperature differential, the plot generated using the technique and algorithms described above for a constant current situation and based on the ambient temperature of the fuse 200 and the deduced current. As shown in FIG. 5B, the plot of the estimated second temperature differential closely follows the plot of the calculated second temperature differential that was generated using a calculation-intensive process, such as ANSYS. In this example, the estimated second temperature differential rapidly increases until a thermal equilibrium condition within the first 25% of the measurement window, further indicating that the arc quenching medium 232 rapidly reaches a steady-state thermal condition relative to the ambient conditions during operation of the fuse 200 while the fuse element 208 is receiving a substantially constant rate of current flow.

FIG. 5C illustrates the plot of the estimated fuse element temperature, the plot generated using the technique and algorithms described above for a constant current situation and based on the ambient temperature of the fuse 200 and the deduced current. As shown in FIG. 5C, the plot of the estimated fuse element temperature closely follows the plot of the calculated second temperature differential that was generated using a calculation-intensive process, such as ANSYS. In this example, the estimated fuse element temperature increases at a rate that is approximately equal to a resultant of the combination of the rate of increase of the estimated first temperature differential and the rate of increase of the estimated second temperature differential until a thermal equilibrium condition is reached within the first 20% of the measurement window.

Exemplary performances of the technique illustrated in FIGS. 3, 4, 5A, 5B, and 5C adopting the concepts and algorithms described above will now be described in additional specific embodiments that are believed to be advantageous in illustrating application of the technique illustrated in FIGS. 3, 4, 5A, 5B, and 5C.

Figure 6:
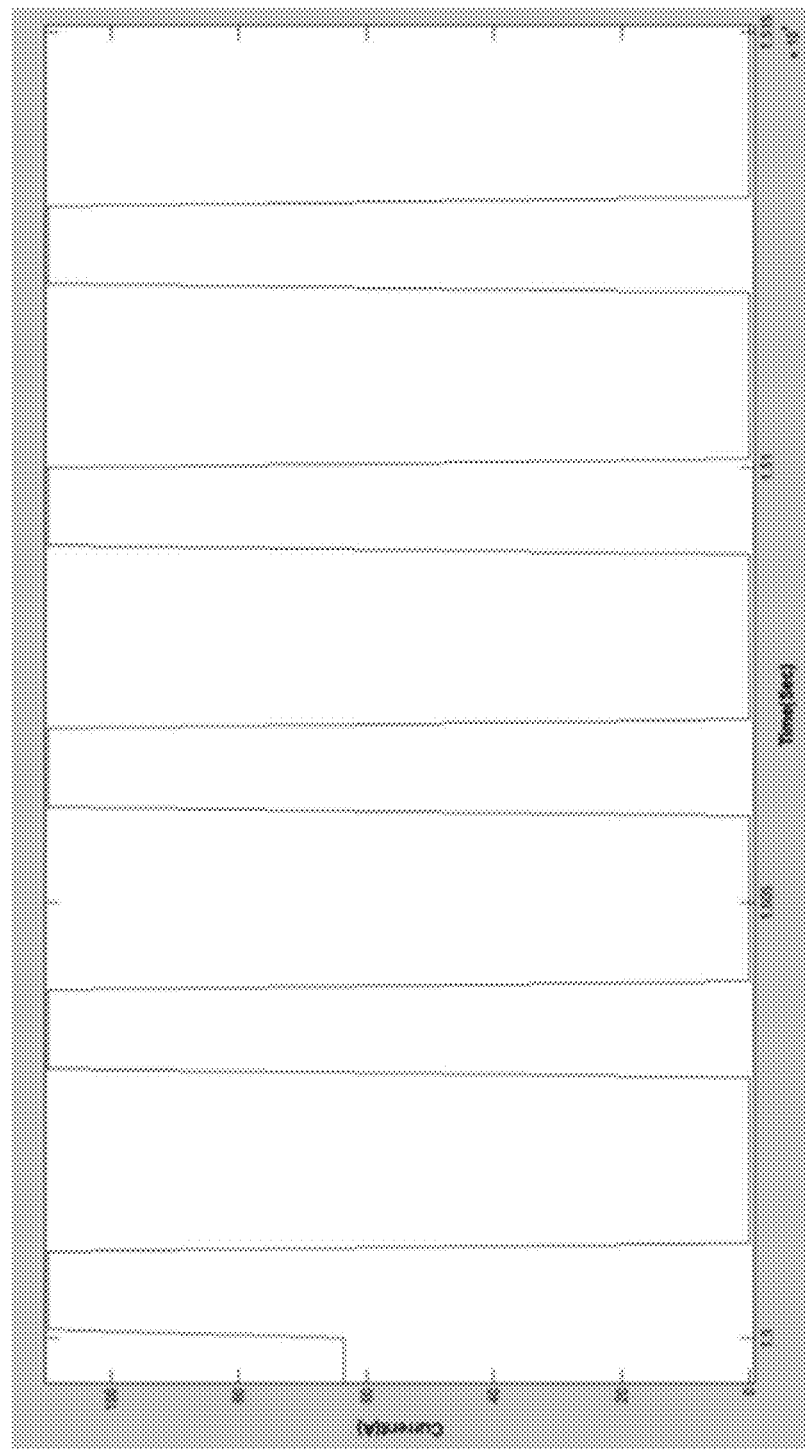
Figure 7A:
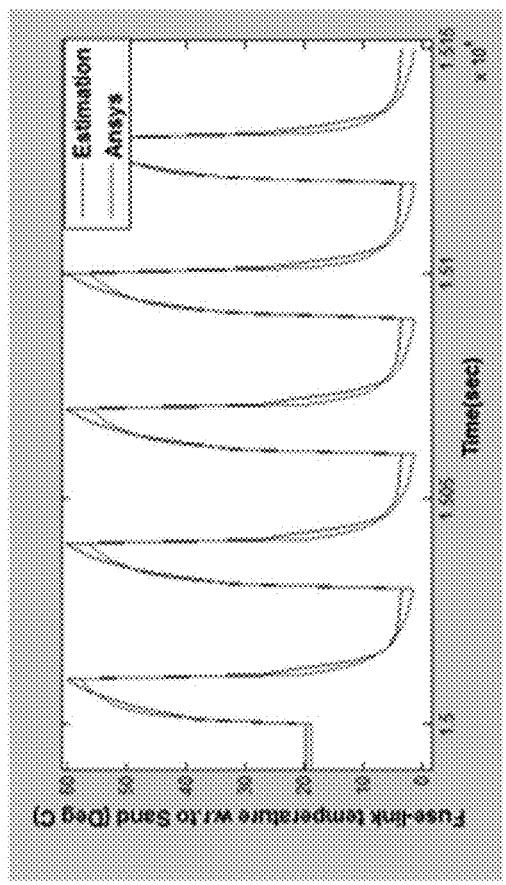
Figure 7B:
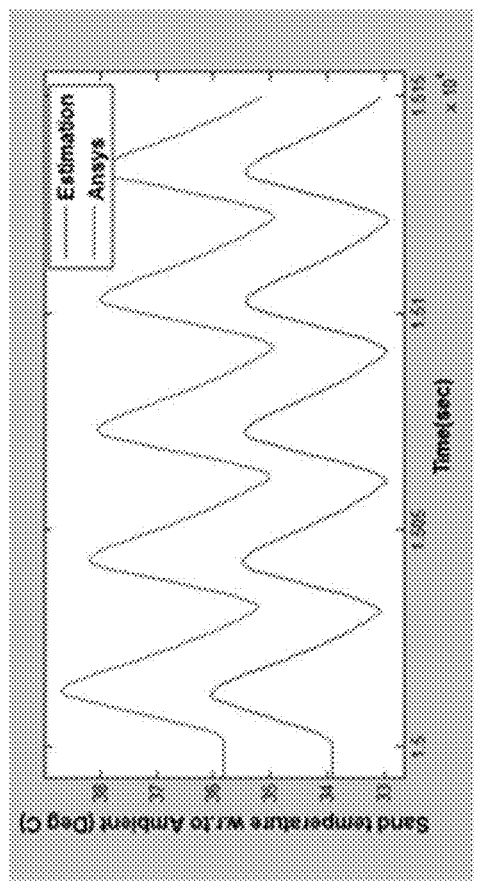
Figure 7C:
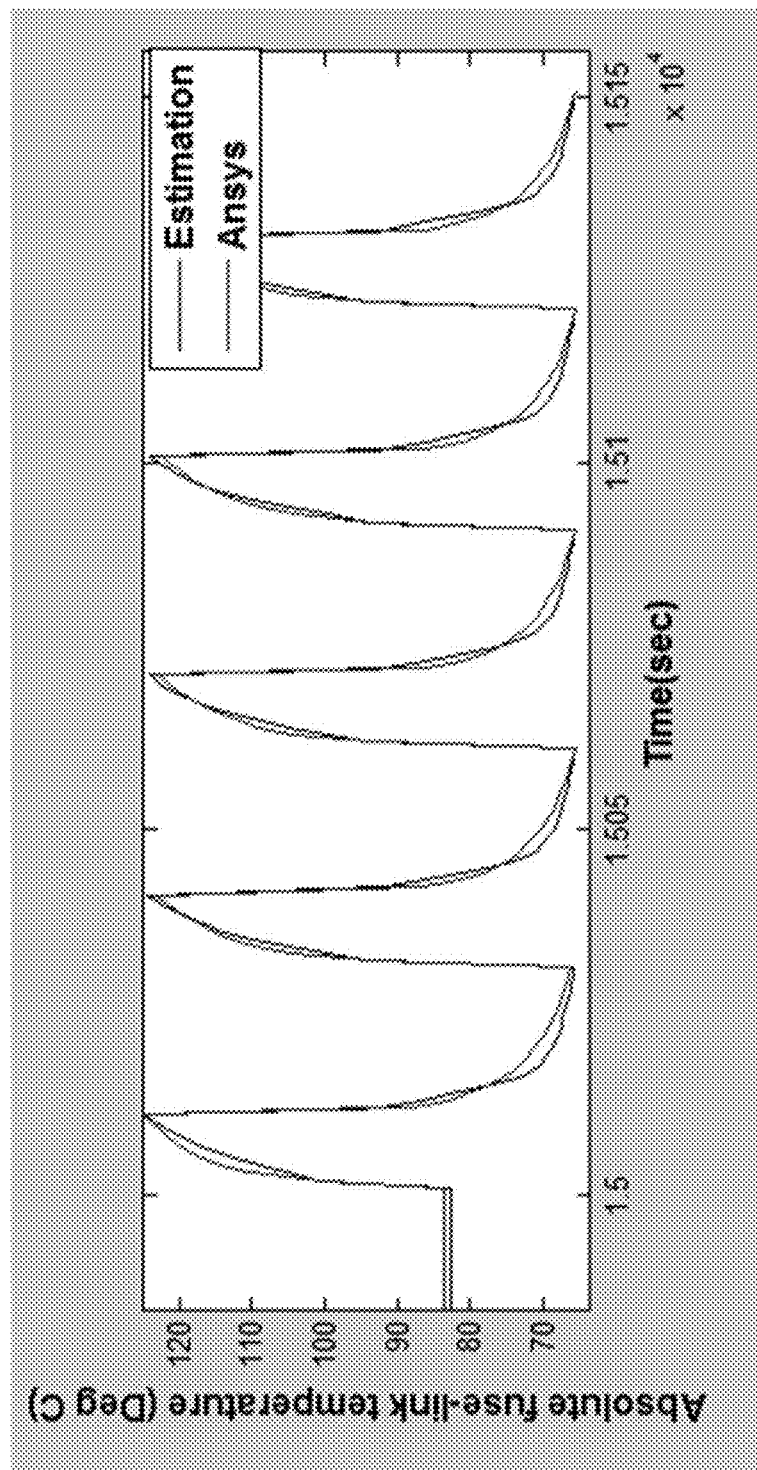

FIG. 6 illustrates a second exemplary performance of the technique illustrated in FIG. 3, wherein FIG. 6 illustrates a second plot of deduced current versus time in the exemplary fuse element. As shown in FIG. 6, the current flowing through fuse 200 is a periodic, pulse-type current. FIGS. 7A, 7B, and 7C represent an exemplary performance of an exemplary temperature estimation technique according to an embodiment of the present invention based on the plot of deduced current versus time illustrated in FIG. 6, wherein FIG. 7A illustrates a plot of a calculated first temperature differential versus time and a plot of an estimated first temperature differential versus time, wherein FIG. 7B illustrates a plot of a calculated second temperature differential versus time and a plot of an estimated second temperature differential versus time, and wherein FIG. 7C illustrates a plot of calculated fuse element temperature versus time and a plot of estimated fuse element temperature versus time.

Figure 8A:
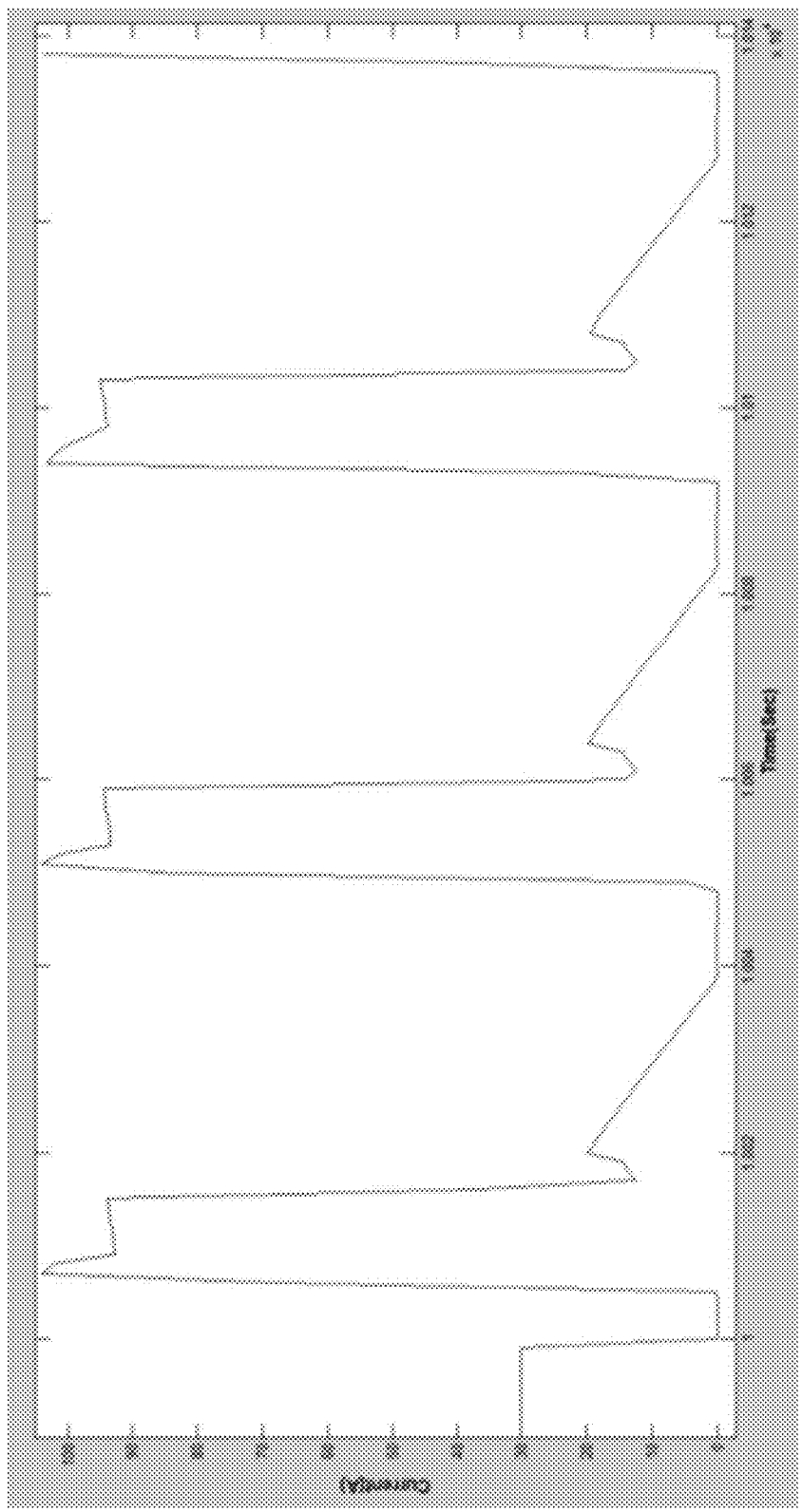
Figure 8B:
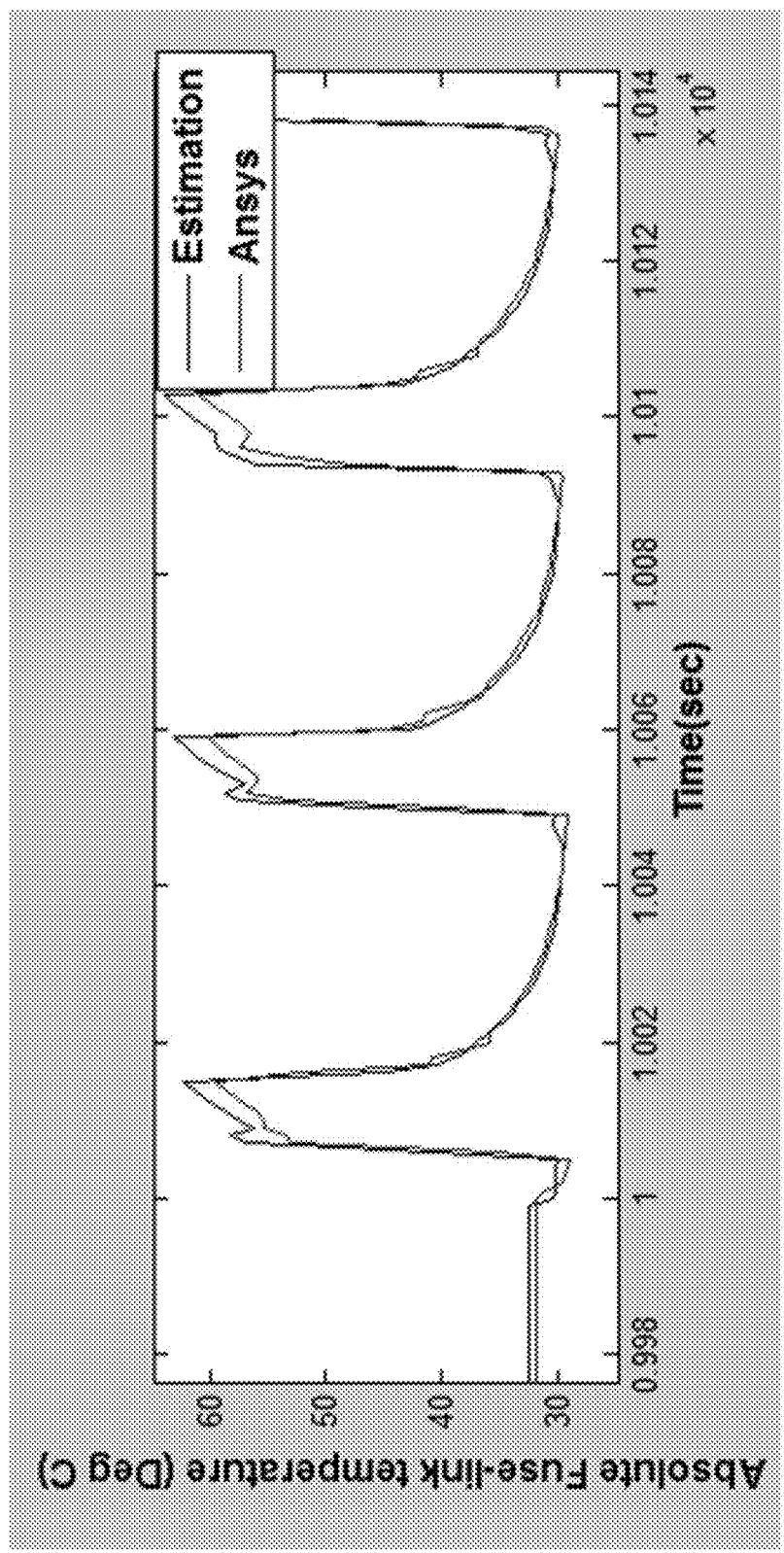

FIG. 8A illustrates a third exemplary performance of the technique illustrated in FIG. 3. FIG. 8A illustrates a third plot of deduced current versus time in the exemplary fuse element, wherein the current flowing through the fuse 200 is a periodic, non-symmetrical pulse-type current. FIG. 8B represents an exemplary performance of an exemplary temperature estimation technique according to an embodiment of the present invention based on the plot of deduced current versus time illustrated in FIG. 8A wherein FIG. 8B illustrates a plot of calculated fuse element temperature versus time and a plot of estimated fuse element temperature versus time. As shown in FIG. 8B, the plot of the estimated fuse element temperature tracks closely with the plot of the calculated fuse element temperature for the non-symmetrical pulse-type current plotted in FIG. 8A.

Figure 9A:
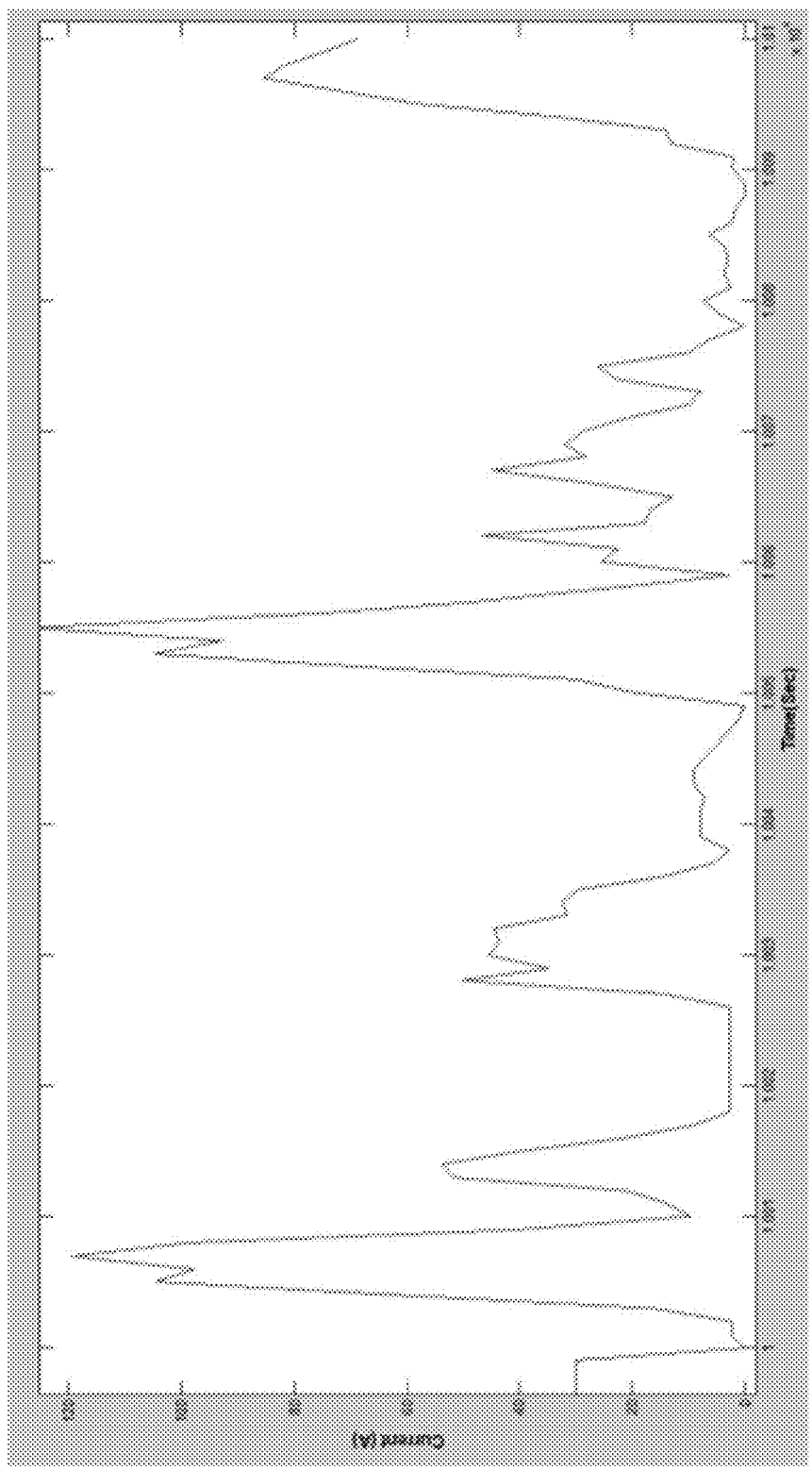
Figure 9B:
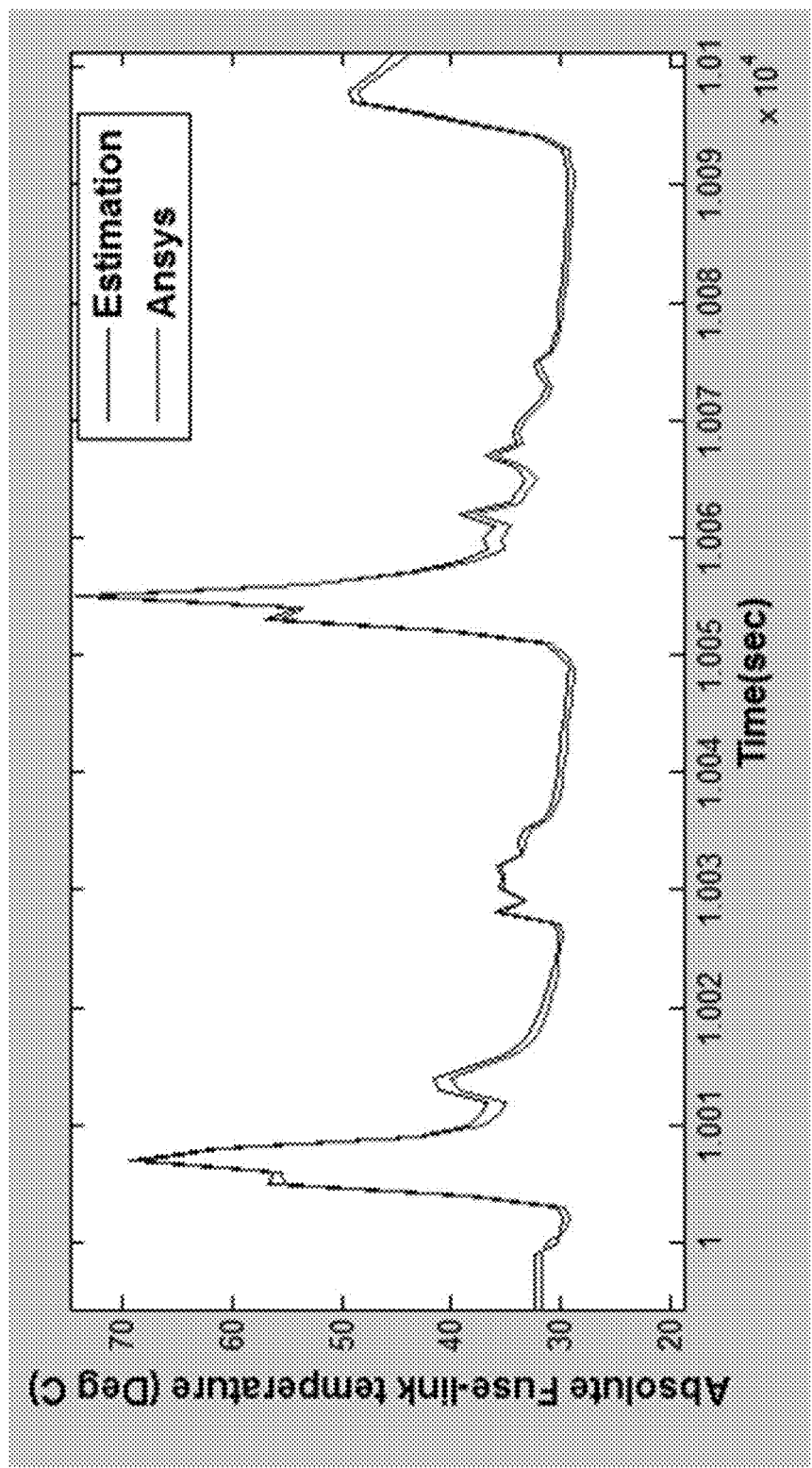

FIG. 9A illustrates a fourth exemplary performance of the technique illustrated in FIG. 3, wherein FIG. 9A illustrates a fourth plot of deduced current versus time in the exemplary fuse element, wherein the current flowing through the fuse 200 is a random, non-symmetrical pulse-type current. FIG. 9B represents an exemplary performance of an exemplary temperature estimation technique according to an embodiment of the present invention based on the plot of deduced current versus time illustrated in FIG. 9A wherein FIG. 9B illustrates a plot of calculated fuse element temperature versus time and a plot of estimated fuse element temperature versus time. As shown in FIG. 9B, the plot of the estimated fuse element temperature tracks closely with the plot of the calculated fuse element temperature for the non-symmetrical random-type current plotted in FIG. 9A.

Figure 10A:
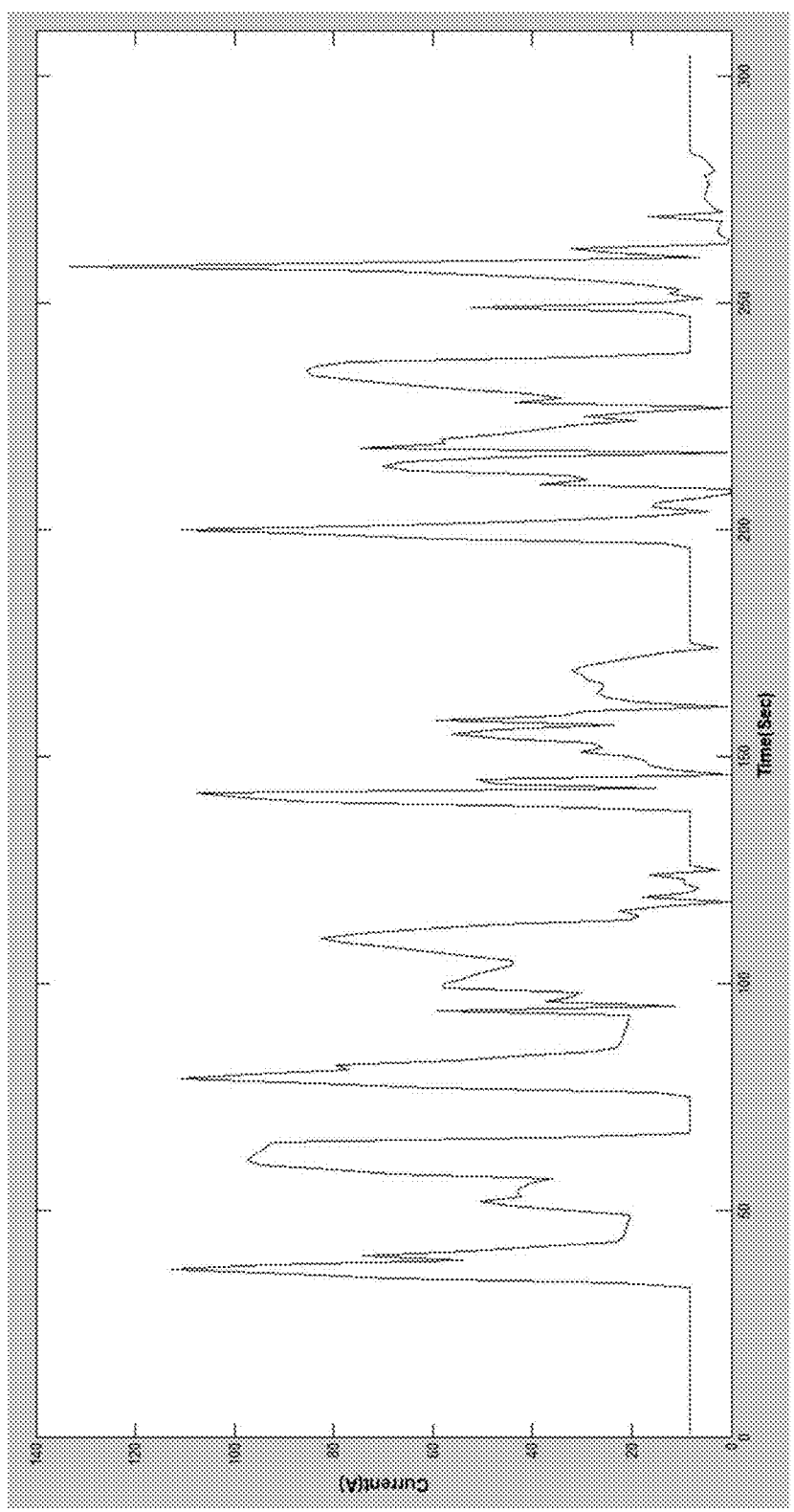
Figure 10B:
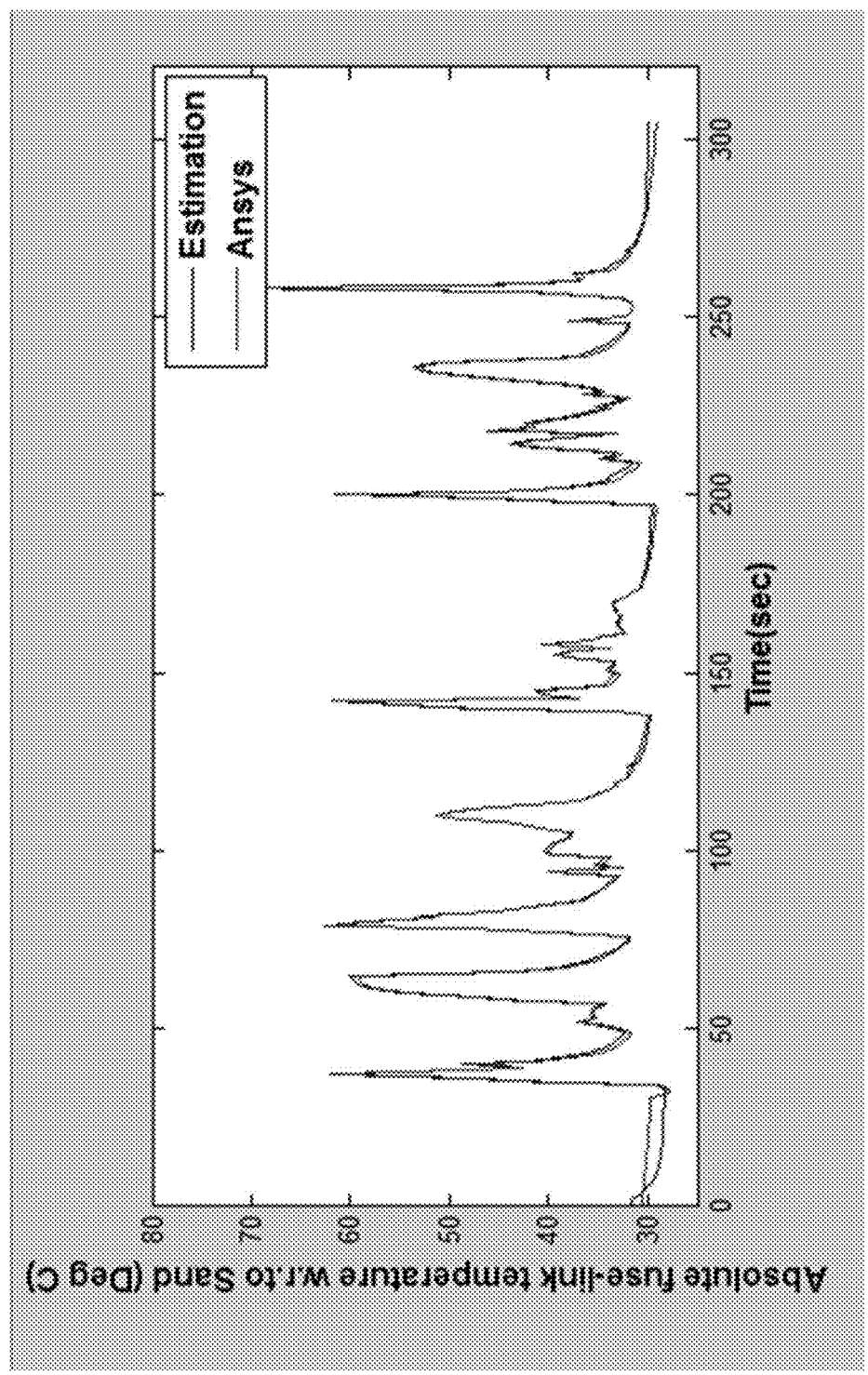

FIG. 10A illustrates a fifth exemplary performance of the technique illustrated in FIG. 3, wherein FIG. 10A illustrates a fifth plot of deduced current versus time in the exemplary fuse element, wherein the current flowing through the fuse 200 is another embodiment of a random, non-symmetrical pulse-type current. FIG. 10B represents an exemplary performance of an exemplary temperature estimation technique according to an embodiment of the present invention based on the plot of deduced current versus time illustrated in FIG. 10A wherein FIG. 10B illustrates a plot of calculated fuse element temperature versus time and a plot of estimated fuse element temperature versus time. As shown in FIG. 10B, the plot of the estimated fuse element temperature tracks closely with the plot of the calculated fuse element temperature for the non-symmetrical random-type current plotted in FIG. 10A.

Figure 11A:
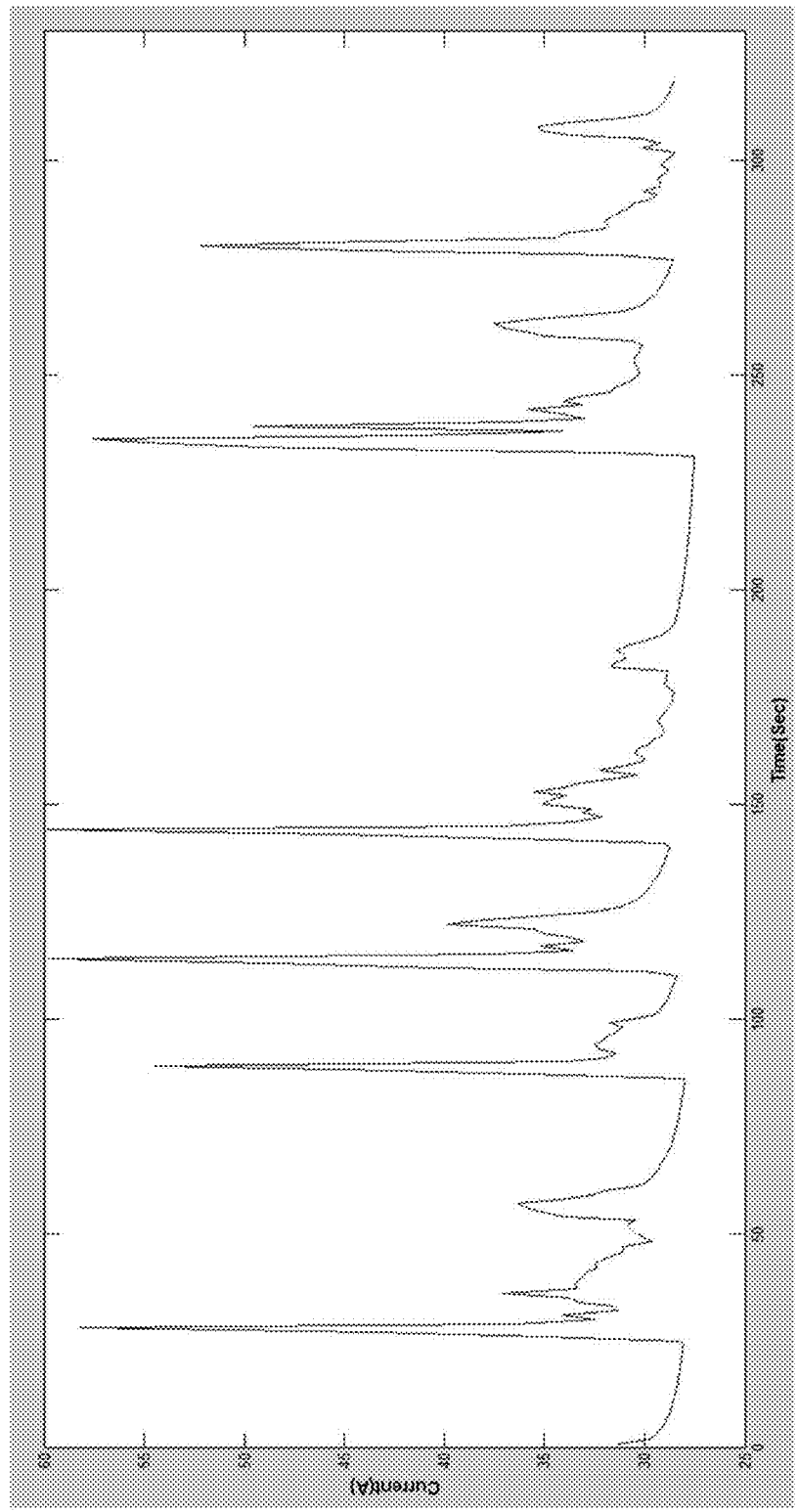
Figure 11B:
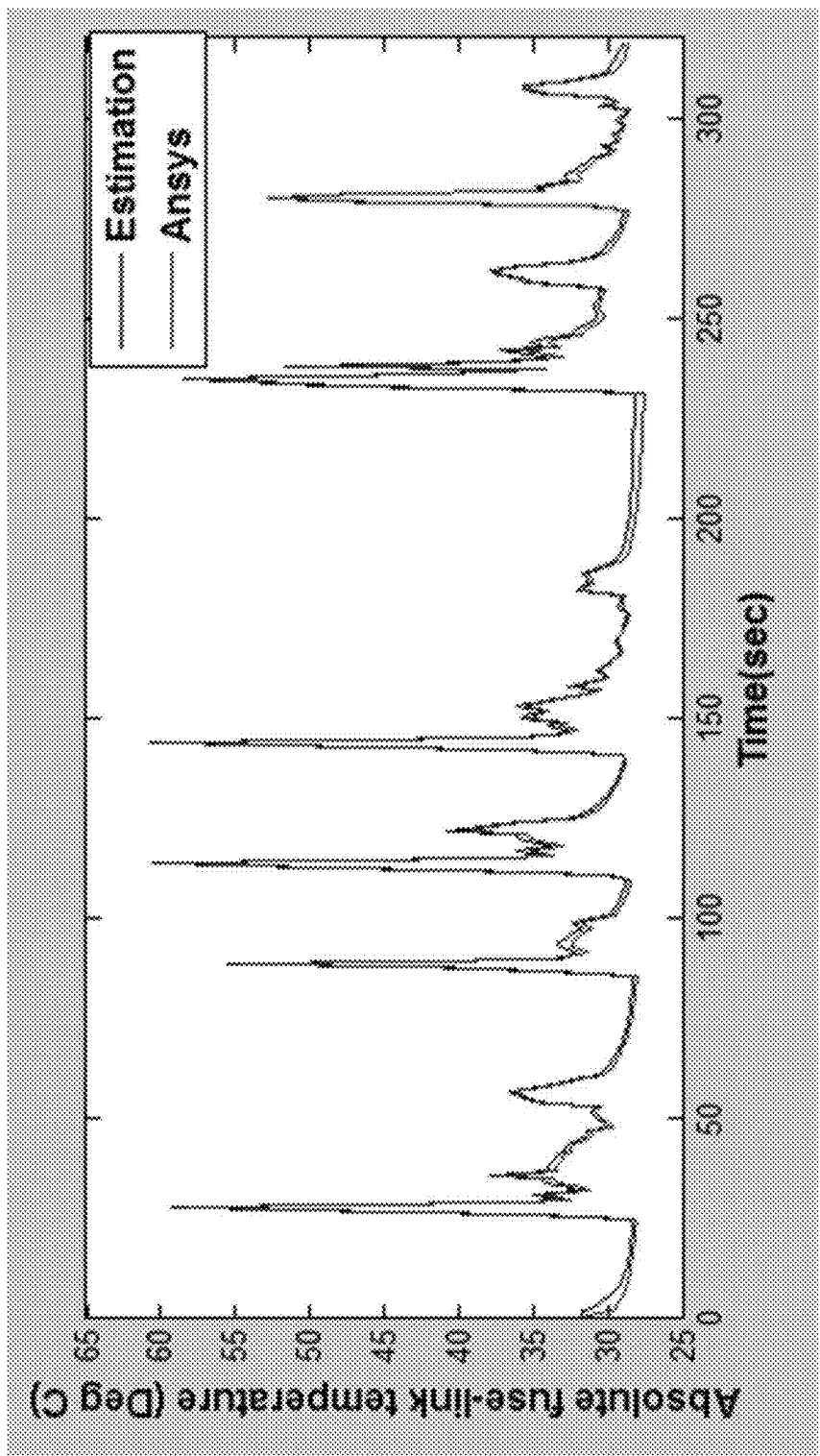

FIG. 11A illustrates a sixth exemplary performance of the technique illustrated in FIG. 3, wherein FIG. 11A illustrates a sixth plot of deduced current versus time in the exemplary fuse element, wherein the current flowing through the fuse 200 is yet another embodiment of a random, non-symmetrical pulse-type current. FIG. 11B represents an exemplary performance of an exemplary temperature estimation technique according to an embodiment of the present invention based on the plot of deduced current versus time illustrated in FIG. 11A wherein FIG. 11B illustrates a plot of calculated fuse element temperature versus time and a plot of estimated fuse element temperature versus time. As shown in FIG. 11B, the plot of the estimated fuse element temperature tracks closely with the plot of the calculated fuse element temperature for the non-symmetrical random-type current plotted in FIG. 11A.

The accuracies with which at least one of the fuse element temperature estimation algorithms described above estimates fuse element temperatures for the current profiles illustrated in FIGS. 4, 6, 8A, 9A, 10A, and 11A are illustrated in the table below. The root-mean-square error (RMSE) for the application of at least one of the algorithms to the above-illustrated current profiles ranges from 0.46° C. to 1.95° C. The maximum error at a peak fuse element temperature for the application of at least one of the algorithms to the above-illustrated current profiles ranges from 1.5° C. to 3.1° C. The largest error at a peak temperature resulting from estimated fuse element temperature for the PLS1 current profile (illustrated in FIGS. 8A and 8B) represents a 5.2% error, approximately, as compared to an ANSYS calculated temperature for the current profile. The smallest error at a peak temperature resulting from estimated fuse element temperature for the Hard-Set2 current profile (illustrated in FIGS. 10A and 10B) represents a 2.1% error, approximately, as compared to an ANSYS calculated temperature for the current profile.

| CURRENT PROFILE | RMS ERROR (° C.) | MAXIMUM ERROR AT PEAK (° C.) |
| --- | --- | --- |
| FIG. 6 | 1.95 | 2 |
| FIG. 8A | 1.24 | 3.1 |
| FIG. 9A | 0.77 | 1.7 |
| FIG. 10A | 0.46 | 1.5 |
| FIG. 11A | 0.47 | 2.1 |

The fuse element temperature estimation algorithms and techniques for temperature estimation described herein represent empirical-based relationships determined through application of scientific and mathematical processes. While the exemplary algorithms and relationships described herein facilitate efficient and effective estimation of a fuse element temperature, it is contemplated that other algorithms and relationships can be utilized to estimate the fuse element temperature through application of the techniques described herein.

Figure 12:
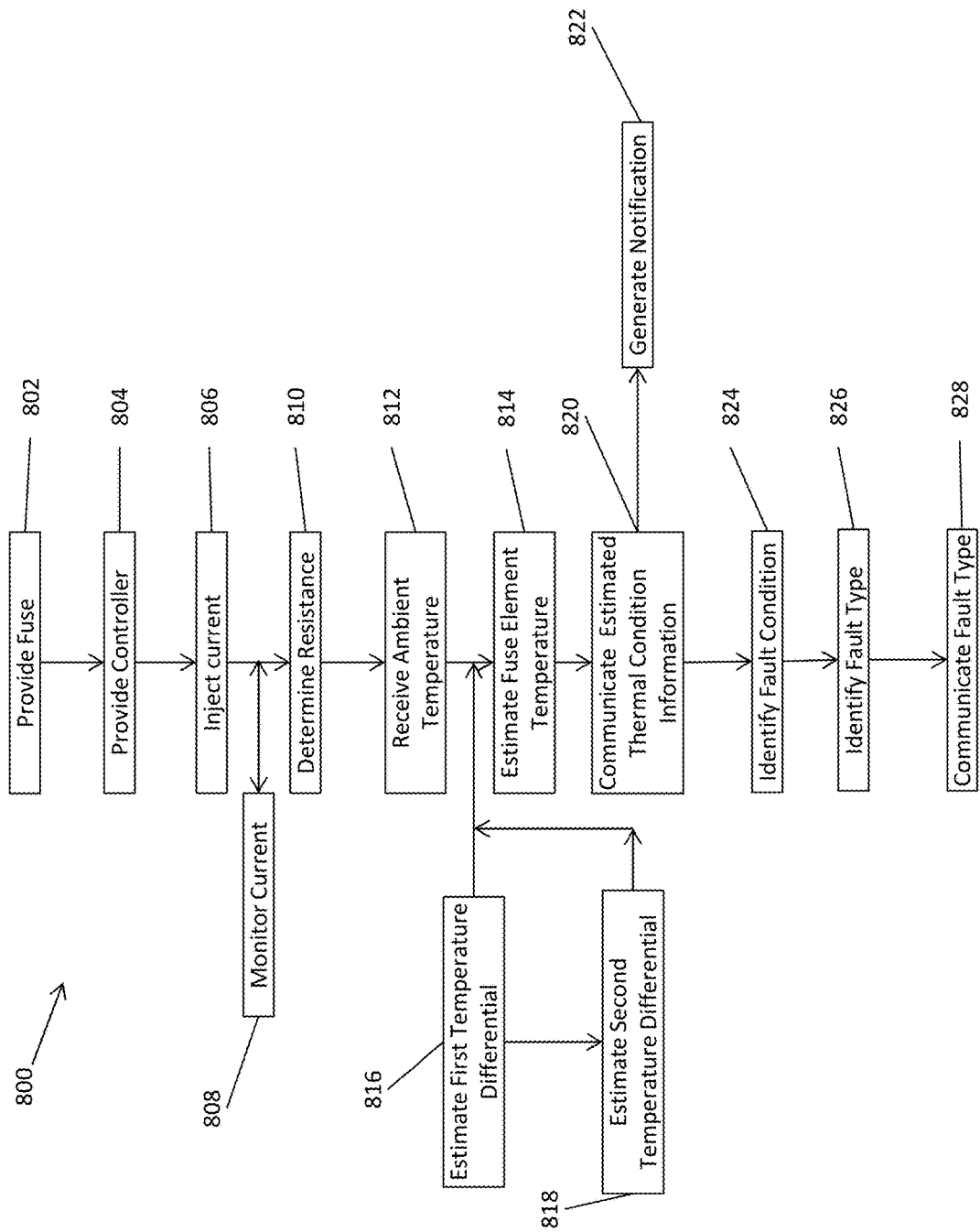
FIG. 12 is a method flowchart illustrating exemplary processes associated with the fuse temperature estimation techniques and systems shown in FIGS. 3-11.

FIG. 12 is a method flowchart illustrating exemplary processes 800 associated with the fuse temperature estimation techniques and systems shown in FIGS. 3-11 that, in turn, allow for fuse fatigue evaluation. The processes 800 may be performed electronically to implement an electrical fuse temperature estimation system such as those described above or still further variations as appropriate or as described to flexibly meet particular needs of different electrical power systems. While the processes 800 may be particularly desirable in EV power system application as described above, they are not limited to EV power system applications and instead may be extended to any power system wherein determining a fuse temperature and the problems discussed above are of practical concern.

As shown in preparatory steps in FIG. 12, a fuse is provided at step 802 and a controller is provided at step 804. As described above, the fuse provided at step 802 may include one or more stamped metal fuse elements that define a geometry including at least one weak spot, and the controller provided at step 804 may include the controllers described above. In contemplated embodiments, the controller may be built-in to the fuse, and as such the steps 802 and 804 may be implemented in a single step, rather than in separate steps. In other contemplated embodiments, the controller may be built-in to a fuse holder or a disconnect switch including the controller. In still other embodiments, however, the controller provided at step 804 may be provided in another manner that facilitates evaluation. In embodiments including more than one controller as contemplated above, additional steps similar to the step 804 would be appropriately performed. When so provided, the controller or controllers supplied may monitor at least one thermal condition parameter over a period of time while the fuse provided at step 802 is connected to an energized electrical power system.

As represented at step 806 a current source may be provided and a current may be injected by the controller. Compensation circuitry such as that described above as that described above may be provided internal or external to the fuse and may be configured to detect current flow through the fuse. Using techniques such as those described above, the controller may be configured to deduce a current in the fuse element. In some cases, an optional separate current sensor (or current sensors) represented at step 808 may also be utilized to facilitate current measurements/deductions, determination of current type (constant or variable), and/or otherwise provide some ability to assess fuse element thermal conditions. As such current injection techniques and compensation circuitry are not necessarily required in all embodiments.

As shown at step 810, the controller is configured to determine the non-linear resistance of the fuse element in the fuse provided at step 802. In a contemplated embodiment, the determined resistance is utilized to calculate or otherwise deduce an amount of current flowing through the fuse element during operation of the EV at any given time.

As represented at step 812, an ambient temperature of the fuse is received by the controller. Such ambient temperature measurement may be received by the controller from a separate temperature sensor positioned in the same environment as the fuse. In some cases the controller is positioned in an environment having the same ambient temperature as the environment in which the fuse is positioned and the controller includes a temperature sensor that measures the ambient temperature at the controller, and therefore the fuse.

In a contemplated embodiment, the calculated or otherwise deduced current in the fuse element and the measured ambient temperature of the environment surrounding the fuse are utilized to estimate a fuse element temperature as shown at step 814. Specifically, and as described above in detail, in some embodiments, based at least on the deduced current in the fuse element and the ambient temperature of the environment surrounding the fuse element, a first temperature differential between a temperature of the fuse element and a temperature of an arc quenching medium is estimated as represented by step 816. Additionally, as described above, based at least on the deduced current in the fuse element and the ambient temperature of the environment surrounding the fuse element, a second temperature differential between the temperature of the arc quenching medium and the ambient temperature is estimated as represented by step 818. Finally, as shown at the step 814, the first temperature differential, the second temperature differential, and the ambient temperature are added together to estimated fuse element temperature.

Once the fuse element temperature is estimated, the controller may communicate information regarding the estimated thermal conditions experienced by the fuse element as shown at step 820. The communication of the thermal conditions experienced by the fuse element may be communicated in any manner such as those described above or known in the art. While wireless communication may be preferred in certain systems, wired communication may be preferred in others, and in some systems both wireless and wired communications could be utilized to provide redundant communication modalities. The fuse element thermal condition communicated may, as described above, be communicated from one controller to another (or from one device to another) before being received at an appropriate destination wherein alerts or notifications can be generated as shown at step 822 to avoid nuisance-type operation of the fuse due to issues related to the thermal conditions experienced by the fuse element. In particular, communication of the information may include a reader device or a remote device in communication with the controller. In embodiments having multiple controllers, the controllers may determine or communication only a portion of the information to another controller or device that may further process the information received until eventually the thermal condition information is available for communication at step 820 for the ultimate purpose of notification at step 822 that the fuse has experienced a predetermined of thermal cycles and/or been exposed to temperatures above a predetermined point. Before such notification is appropriately generated, the thermal condition exposure information may be recorded and communicated as well to facilitate data archival and analysis functionality, as well as desired reports. This thermal condition exposure information can be used to assess the fatigue of the fuse element in view of the estimated thermal conditions experienced by the fuse element. These assessments can be made using an empirical model, applying Miner's rule of accumulated damage components of thermal cycles, fuse life regression models, or by other fuse life estimation models and techniques familiar to those in the art.

After the notification of step 822 is generated, some lead time may be afforded so that an appropriate action may be taken in regards to the notification, which may include fuse replacement, inspection, and/or further data logging to ensure that the use and enjoyment of the power system is not interrupted. In applications such as in the EV power system applications discussed, system reliability and user satisfaction can be enhanced by avoiding an otherwise unpredictable nuisance-type operation of the fuse attributable to fuse fatigue at least partially resulting from thermal fatigue of the fuse.

As shown at step 824, the controller may be configured to identify a fault condition based on the fuse element temperature. At step 826, the controller may also be configured to identify a specific type of fault condition in the electrical power system using techniques such as those described above (e.g., fault identification based on an assessment window of a predetermined duration). At step 828, the controller may be configured to communicate the type of fault condition. Such communication of specific types of fault conditions may be valuable to troubleshoot or optimize electrical power systems over time, as well as to provide real time feedback concerning the performance of electrical fuses in an electrical power system.

Having described the relationships, algorithms and computations functionally per the description above, those in the art may accordingly implement the relationships, algorithms and computations via programming of the controllers or other processor-based devices. Such programming or implementation of the concepts described is believed to be within the purview of those in the art and will not be described further.

The advantages and benefits of the invention are now believed to have been amply demonstrated in the exemplary embodiments disclosed.

An embodiment of a thermal-mechanical assessment system has been disclosed including an electrical conductor having a non-linear resistance when connected to an energized electrical power system, and a controller operable to estimate an operating temperature of the conductor based on an ambient temperature input, a determined resistance, and a current flowing through the conductor at the determined resistance in the energized electrical power system over time.

Optionally, the system includes an electrical fuse including a housing, first and second terminal elements, and a fuse element having the non-linear resistance when connected to an electrical power system. The controller may be further configured to: estimate the temperature of the fuse element based on an addition of an estimated first temperature differential, an estimated second temperature differential, and the ambient temperature; wherein the estimated first temperature differential is an estimated temperature differential between a temperature of the fuse element and a temperature of an arc quenching medium surrounding the fuse element, the estimated first temperature differential estimated based on the ambient temperature and the current flowing through the fuse element; and wherein the estimated second temperature differential is an estimated temperature differential between the temperature of the arc quenching medium and the ambient temperature, the estimated second temperature differential estimated based on the ambient temperature and the current flowing through the fuse element.

The controller may also be configured to estimate the first temperature differential, the second temperature differential, and the fuse element temperature using at least one Z-domain transfer function. The controller may likewise be configured to estimate the first temperature differential, the second temperature differential, and the fuse element temperature using at least one time-domain algorithm. The controller is configured to wirelessly communicate at least one of the ambient temperature, the current flowing through the conductor, the estimated first temperature differential, the estimated second temperature differential, and the estimated fuse element temperature. The controller may be configured to assess a state of fatigue of the conductor based on at least one of the estimated first temperature differential, the estimated second temperature differential, and the estimated fuse element temperature.

As further options, the controller may be configured to measure the ambient temperature. The controller may also be configured to calculate the current flowing through the conductor based on the determined resistance.

An embodiment of an electrical conductor temperature estimation system for evaluating thermal-mechanical fatigue comprising has also been disclosed. The system includes an electrical fuse including a housing, first and second terminal elements, and a fuse element having a non-linear resistance when connected to an energized electrical power system, and a controller receiving an ambient temperature input and operable to estimate an operating temperature of the fuse element in the energized electrical power system. The estimated temperature of the fuse element is based on an addition of an estimated first temperature differential, an estimated second temperature differential, and the ambient temperature. The estimated first temperature differential is an estimated temperature differential between a temperature of the fuse element and a temperature of an arc quenching medium surrounding the fuse element, and the estimated first temperature differential estimated is based on the ambient temperature and a current flowing through the fuse element. The estimated second temperature differential is an estimated temperature differential between the temperature of the arc quenching medium and the ambient temperature, and the estimated second temperature differential estimated based on the ambient temperature and the current flowing through the fuse element.

Optionally, the controller is further configured to estimate the first temperature differential, the second temperature differential, and the fuse element temperature using at least one Z-domain transfer function. The controller may be also be further configured to estimate the first temperature differential, the second temperature differential, and the fuse element temperature using at least one time-domain algorithm.

The controller may be configured to wirelessly communicate at least one of the ambient temperature, the current flowing through the conductor, the estimated first temperature differential, the estimated second temperature differential, and the estimated fuse element temperature. The controller may be configured to identify a type of fault in the electrical power system based on at least one of the estimated first temperature differential, the estimated second temperature differential, and the estimated fuse element temperature.

The controller may be configured to measure the ambient temperature, and the controller is configured to determine the resistance of the electrical conductor and to calculate the current flowing through the conductor based on the determined resistance.

A method of estimating a temperature of an electrical conductor in an electrical power system has also been disclosed. The method includes providing an electrical conductor having a non-linear resistance when connected to an electrical power system, receiving an ambient temperature input and a current flowing through the conductor, and estimating a temperature of the conductor based on at least the ambient temperature and the current flowing through the conductor.

Providing the conductor having a non-linear resistance when connected to an electrical power system may include providing an electrical fuse including a housing, first and second terminal elements, and a fuse element. Estimating the temperature of the conductor may include estimating the temperature of the fuse element based on an addition of an estimated first temperature differential, an estimated second temperature differential, and the ambient temperature. The estimated first temperature differential may be an estimated temperature differential between a temperature of the fuse element and a temperature of an arc quenching medium surrounding the fuse element, and the estimated first temperature differential estimated is based on the ambient temperature and the current flowing through the fuse element. The estimated second temperature differential is an estimated temperature differential between the temperature of the arc quenching medium and the ambient temperature, and the estimated second temperature differential estimated is based on the ambient temperature and the current flowing through the fuse element.

The method may also include wirelessly communicating at least one of the ambient temperature, the current flowing through the conductor, the estimated first temperature differential, the estimated second temperature differential, and the estimated fuse element temperature.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A thermal-mechanical fatigue assessment system comprising:
   an electrical conductor having a non-linear resistance when connected to an energized electrical power system; and
   a controller operable to iteratively estimate over a successive period of time an operating temperature of the electrical conductor based on an ambient temperature input, a determined resistance at each successive time, and a current flowing through the conductor at the determined resistance in the energized electrical power system.

2. The thermal-mechanical fatigue assessment system of claim 1, wherein the electrical conductor is an electrical fuse including a housing, first and second terminal elements, and a fuse element having the non-linear resistance when connected to the electrical power system.

3. The thermal-mechanical fatigue assessment system of claim 2, wherein the controller is further configured to:
   estimate the operating temperature of the fuse element based on an addition of an estimated first temperature differential, an estimated second temperature differential, and the ambient temperature input;
   wherein the estimated first temperature differential is an estimated temperature differential between a temperature of the fuse element and a temperature of an arc quenching medium surrounding the fuse element, the estimated first temperature differential estimated based on the ambient temperature input and the current flowing through the fuse element; and
   wherein the estimated second temperature differential is an estimated temperature differential between the temperature of the arc quenching medium and the ambient temperature input, the estimated second temperature differential based on the ambient temperature input and the current flowing through the fuse element.

4. The thermal-mechanical fatigue assessment system of claim 3, wherein the controller is further configured to estimate the first temperature differential, the second temperature differential, and the operating fuse element temperature using at least one Z-domain transfer function.

5. The thermal-mechanical fatigue assessment system of claim 3, wherein the controller is further configured to estimate the first temperature differential, the second temperature differential, and the operating fuse element temperature using at least one time-domain algorithm.

6. The thermal-mechanical fatigue assessment system of claim 3, wherein the controller is configured to wirelessly communicate at least one of the ambient temperature input, the current flowing through the conductor, the estimated first temperature differential, the estimated second temperature differential, and the estimated operating fuse element temperature.

7. The thermal-mechanical fatigue assessment system of claim 3, wherein the controller is configured to assess a state of fatigue of the fuse element based on at least one of the estimated first temperature differential, the estimated second temperature differential, and the estimated operating fuse element temperature.

8. The thermal-mechanical fatigue assessment system of claim 1, wherein the controller is configured to measure the ambient temperature input.

9. The thermal-mechanical fatigue assessment system of claim 1, wherein the controller is configured to calculate the current flowing through the electrical conductor based on the determined resistance.

10. An electrical conductor temperature estimation system for evaluating thermal-mechanical fatigue comprising:
an electrical fuse including a housing, first and second terminal elements, and a fuse element having a non-linear resistance when connected to an energized electrical power system;
a controller receiving an ambient temperature input and operable to estimate an operating temperature of the fuse element in the energized electrical power system; and
wherein the estimated operating temperature of the fuse element is estimated based on an addition of an estimated first temperature differential, an estimated second temperature differential, and the ambient temperature;
wherein the estimated first temperature differential is an estimated temperature differential between a temperature of the fuse element and a temperature of an arc quenching medium surrounding the fuse element, the estimated first temperature differential based on the ambient temperature and a current flowing through the fuse element; and
wherein the estimated second temperature differential is an estimated temperature differential between the temperature of the arc quenching medium and the ambient temperature, the estimated second temperature differential based on the ambient temperature and the current flowing through the fuse element.

11. The electrical conductor temperature estimation system of claim 10, wherein the controller is further configured to estimate the first temperature differential, the second temperature differential, and the fuse element temperature using at least one Z-domain transfer function.

12. The electrical conductor temperature estimation system of claim 10, wherein the controller is further configured to estimate the first temperature differential, the second temperature differential, and the operating fuse element temperature using at least one time-domain algorithm.

13. The electrical conductor temperature estimation system of claim 10, wherein the controller is configured to wirelessly communicate at least one of the ambient temperature, the current flowing through the conductor, the estimated first temperature differential, the estimated second temperature differential, and the estimated operating fuse element temperature.

14. The electrical conductor temperature estimation system of claim 10, wherein the controller is configured to identify a type of fault in the electrical power system based on at least one of the estimated first temperature differential, the estimated second temperature differential, and the estimated operating fuse element temperature.

15. The electrical conductor temperature estimation system of claim 10, wherein the controller is configured to measure the ambient temperature.

16. The electrical conductor temperature estimation system of claim 10, wherein the controller is configured to determine the resistance of the fuse element and to calculate the current flowing through the fuse element based on the determined resistance.

17. A method of estimating a temperature of an electrical conductor in an electrical power system, the method comprising:
providing an electrical conductor having a non-linear resistance when connected to an electrical power system;
determining a resistance of the electrical conductor at successive periods of time;
calculating a current flowing through the electrical conductor based on the determined resistance;
receiving an ambient temperature input of the electrical conductor; and
iteratively estimating at each period of time a temperature of the electrical conductor based on at least the ambient temperature input and the current flowing through the conductor.

18. The method of claim 17, wherein providing the electrical conductor having a non-linear resistance when connected to an electrical power system comprises providing an electrical fuse including a housing, first and second terminal elements, and a fuse element.

19. The method of claim 18, wherein estimating the temperature of the electrical conductor comprises:
estimating the temperature of the fuse element based on an addition of an estimated first temperature differential, an estimated second temperature differential, and the ambient temperature input;
wherein the estimated first temperature differential is an estimated temperature differential between a temperature of the fuse element and a temperature of an arc quenching medium surrounding the fuse element, the estimated first temperature differential estimated based on the ambient temperature electrical and the calculated current flowing through the fuse element; and
wherein the estimated second temperature differential is an estimated temperature differential between the temperature of the arc quenching medium and the ambient temperature input, the estimated second temperature differential estimated based on the ambient temperature input and the calculated current flowing through the fuse element.

20. The method of claim 19 further comprising wirelessly communicating at least one of the ambient temperature input, the calculated current flowing through the fuse element, the estimated first temperature differential, the estimated second temperature differential, and the estimated fuse element temperature.

* * * * *